(12) United States Patent
Lin et al.

(10) Patent No.: US 9,978,654 B2
(45) Date of Patent: May 22, 2018

(54) SEMICONDUCTOR DEVICE AND METHOD OF FORMING DUAL-SIDED INTERCONNECT STRUCTURES IN FO-WLCSP

(71) Applicant: STATS ChipPAC, Ltd., Singapore (SG)

(72) Inventors: Yaojian Lin, Singapore (SG); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 6 days.

(21) Appl. No.: 13/832,449

(22) Filed: Mar. 15, 2013

(65) Prior Publication Data
US 2014/0077363 A1    Mar. 20, 2014

Related U.S. Application Data

(60) Provisional application No. 61/701,366, filed on Sep. 14, 2012.

(51) Int. Cl.
*H01L 21/44* (2006.01)
*H01L 21/48* (2006.01)
(Continued)

(52) U.S. Cl.
CPC ............ *H01L 22/32* (2013.01); *H01L 21/486* (2013.01); *H01L 21/4853* (2013.01);
(Continued)

(58) Field of Classification Search
CPC . H01L 22/12; H01L 23/3121; H01L 23/3128; H01L 22/14; H01L 22/20; H01L 23/5389; H01L 23/49816; H01L 25/105; H01L 24/97; H01L 24/19; H01L 23/28; H01L 21/56; H01L 23/49811;
(Continued)

(56) References Cited

U.S. PATENT DOCUMENTS 4,955,523 A    9/1990  Calomagno et al.
5,371,654 A   12/1994  Beaman et al.
(Continued)

*Primary Examiner* — Kimberly Rizkallah
*Assistant Examiner* — Dilinh Nguyen
(74) *Attorney, Agent, or Firm* — Robert D. Atkins; Patent Law Group: Atkins and Associates, P.C.

(57) ABSTRACT

A semiconductor device has a substrate including first and second conductive layers formed over first and second opposing surfaces of the substrate. A plurality of wire studs or stud bumps is formed over the substrate. A semiconductor die is mounted to the substrate between the wire studs. A first encapsulant is deposited around the semiconductor die. A first interconnect structure is formed over the semiconductor die and first encapsulant. A second encapsulant is deposited over the substrate, semiconductor die, and first interconnect structure. The second encapsulant can be formed over a portion of the semiconductor die and side surface of the substrate. A portion of the second encapsulant is removed to expose the substrate and first interconnect structure. A second interconnect structure is formed over the second encapsulant and first interconnect structure and electrically coupled to the wire studs. A discrete semiconductor device can be formed on the interconnect structure.

24 Claims, 20 Drawing Sheets

(51) Int. Cl.
| | | |
|---|---|---|
| *H01L 21/50* | (2006.01) | |
| *H01L 21/66* | (2006.01) | |
| *H01L 21/56* | (2006.01) | |
| *H01L 23/498* | (2006.01) | |
| *H01L 23/28* | (2006.01) | |
| *H01L 23/00* | (2006.01) | |
| *H01L 25/10* | (2006.01) | |
| *H01L 23/31* | (2006.01) | |
| *H01L 21/78* | (2006.01) | |
| *H01L 23/538* | (2006.01) | |

(52) U.S. Cl.
CPC ............ *H01L 21/56* (2013.01); *H01L 21/565* (2013.01); *H01L 21/78* (2013.01); *H01L 22/12* (2013.01); *H01L 22/14* (2013.01); *H01L 22/20* (2013.01); *H01L 23/28* (2013.01); *H01L 23/3114* (2013.01); *H01L 23/3121* (2013.01); *H01L 23/3128* (2013.01); *H01L 23/49811* (2013.01); *H01L 23/49816* (2013.01); *H01L 23/49833* (2013.01); *H01L 23/5384* (2013.01); *H01L 23/5386* (2013.01); *H01L 23/5389* (2013.01); *H01L 24/13* (2013.01); *H01L 24/19* (2013.01); *H01L 24/97* (2013.01); *H01L 25/105* (2013.01); *H01L 23/49822* (2013.01); *H01L 23/5383* (2013.01); *H01L 2224/13025* (2013.01); *H01L 2224/16225* (2013.01); *H01L 2224/32225* (2013.01); *H01L 2224/48091* (2013.01); *H01L 2224/73204* (2013.01); *H01L 2224/73265* (2013.01); *H01L 2224/73267* (2013.01); *H01L 2224/81005* (2013.01); *H01L 2224/92125* (2013.01); *H01L 2224/92244* (2013.01); *H01L 2225/1023* (2013.01); *H01L 2225/1041* (2013.01); *H01L 2225/1058* (2013.01); *H01L 2924/01322* (2013.01); *H01L 2924/12041* (2013.01); *H01L 2924/12042* (2013.01); *H01L 2924/1305* (2013.01); *H01L 2924/1306* (2013.01); *H01L 2924/13091* (2013.01); *H01L 2924/15311* (2013.01); *H01L 2924/181* (2013.01); *H01L 2924/19105* (2013.01); *H01L 2924/19107* (2013.01)

(58) Field of Classification Search
CPC ... H01L 2924/01322; H01L 2924/1305; H01L 2924/1306; H01L 2924/12041; H01L 2225/1023; H01L 2225/1058; H01L 2225/1041; H01L 2224/32225; H01L 2224/92125; H01L 2224/92244; H01L 22/32; H01L 21/78; H01L 24/13; H01L 23/5386; H01L 21/4853; H01L 21/486; H01L 23/5384; H01L 23/3114; H01L 21/565; H01L 23/49833; H01L 2224/13025; H01L 2924/12042; H01L 2924/181; H01L 2224/73267

USPC ....... 438/612, 613, 118, 622, 623, 624, 637, 438/640, 667, 668, 672, 675, 666, 618, 438/107, 110

See application file for complete search history.

(56) References Cited

U.S. PATENT DOCUMENTS

| | | |
|---|---|---|
| 5,455,390 A | 10/1995 | DiStefano et al. |
| 5,495,667 A | 3/1996 | Farnworth et al. |
| 5,601,740 A | 2/1997 | Eldridge et al. |
| 6,133,072 A | 10/2000 | Fjelstad |
| 6,207,549 B1 | 3/2001 | Higashi et al. |
| 6,476,503 B1 | 11/2002 | Imamura et al. |
| 6,477,768 B1 | 11/2002 | Wildner |
| 6,690,090 B2 | 2/2004 | Kimura |
| 6,972,496 B2 | 12/2005 | Choi |
| 7,227,095 B2 | 6/2007 | Roberts et al. |
| 7,497,694 B2 | 3/2009 | Kariya et al. |
| 7,608,921 B2 | 10/2009 | Pendse |
| 7,855,462 B2 * | 12/2010 | Boon et al. ................... 257/784 |
| 7,994,431 B2 | 8/2011 | Yamano et al. |
| 8,035,210 B2 * | 10/2011 | Yang et al. ................... 257/686 |
| 8,035,211 B2 | 10/2011 | Ko et al. |
| 8,138,017 B2 | 3/2012 | Chin |
| 8,174,119 B2 | 5/2012 | Pendse |
| 8,193,034 B2 | 6/2012 | Pagaila et al. |
| 8,466,544 B2 | 6/2013 | Pagaila |
| 2006/0084253 A1 | 4/2006 | Mizukoshi et al. |
| 2007/0108583 A1 | 5/2007 | Shim et al. |
| 2009/0008762 A1 | 1/2009 | Jung |
| 2009/0072375 A1 | 3/2009 | Song et al. |
| 2009/0166835 A1 | 7/2009 | Yang et al. |
| 2009/0261466 A1 * | 10/2009 | Pagaila ............... H01L 21/6835 |
| | | 257/686 |
| 2009/0273094 A1 | 11/2009 | Ha et al. |
| 2010/0133675 A1 * | 6/2010 | Yu ..................... H01L 23/49833 |
| | | 257/686 |
| 2010/0193928 A1 | 8/2010 | Zudock et al. |
| 2010/0214759 A1 | 8/2010 | Beddingfield et al. |
| 2010/0244222 A1 | 9/2010 | Chi et al. |
| 2010/0270656 A1 | 10/2010 | Do et al. |
| 2011/0068444 A1 | 3/2011 | Chi et al. |
| 2011/0204509 A1 * | 8/2011 | Lin ..................... H01L 21/4857 |
| | | 257/692 |
| 2012/0001328 A1 * | 1/2012 | Chang ................ H01L 23/3128 |
| | | 257/738 |
| 2012/0012990 A1 * | 1/2012 | Pagaila ............... H01L 23/5389 |
| | | 257/659 |
| 2012/0018900 A1 | 1/2012 | Pagaila et al. |
| 2012/0038064 A1 | 2/2012 | Camacho et al. |
| 2012/0049366 A1 * | 3/2012 | Zeng ............................ 257/738 |
| 2012/0056329 A1 | 3/2012 | Pagaila et al. |
| 2012/0119388 A1 | 5/2012 | Cho et al. |
| 2012/0217645 A1 | 8/2012 | Pagaila |
| 2012/0273960 A1 | 11/2012 | Park et al. |
| 2013/0147041 A1 | 6/2013 | Chan et al. |
| 2013/0249080 A1 * | 9/2013 | Lin ................... H01L 23/49816 |
| | | 257/737 |
| 2013/0270682 A1 | 10/2013 | Hu et al. |
| 2013/0292850 A1 | 11/2013 | Chua et al. |

\* cited by examiner

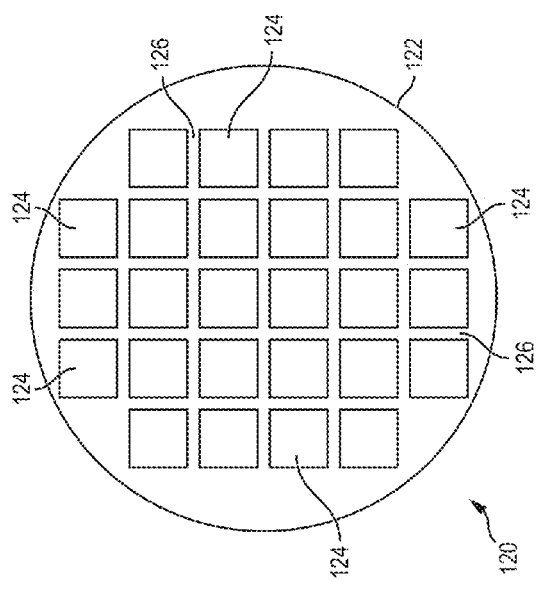
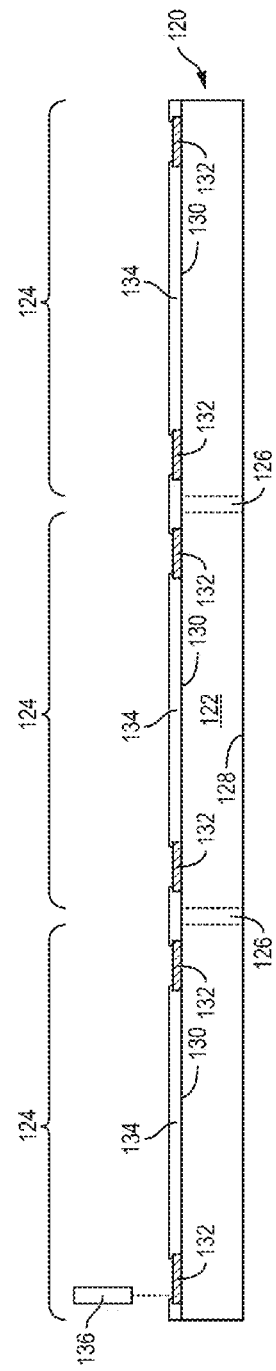
FIG. 3a
FIG. 3b

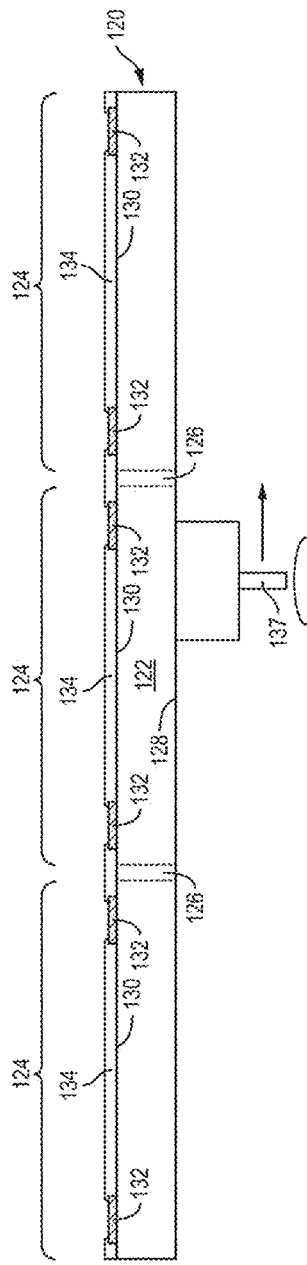
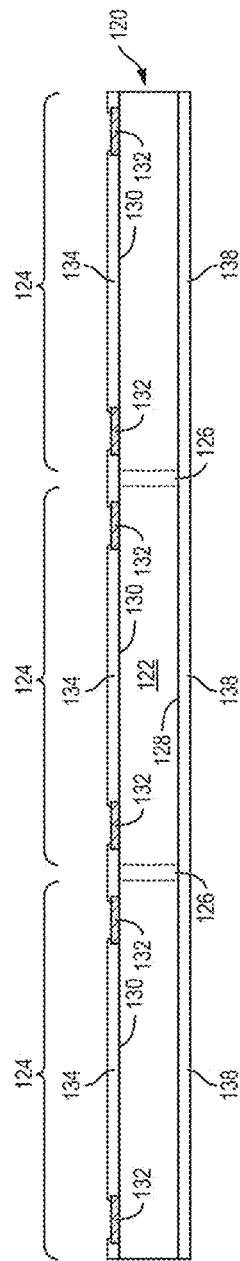
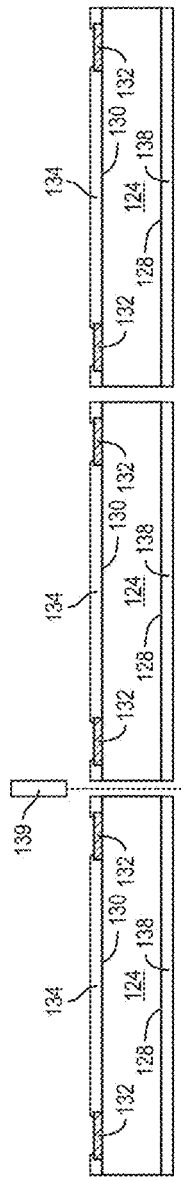
FIG. 3c
FIG. 3d
FIG. 3e

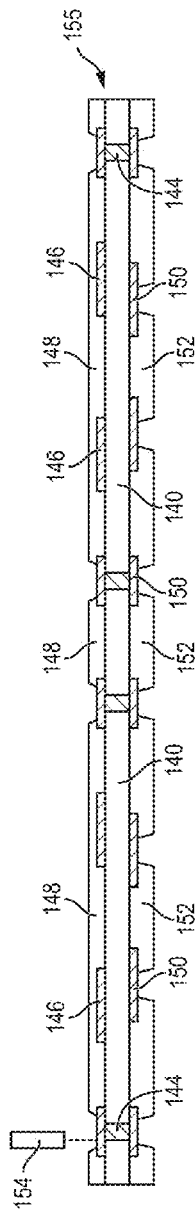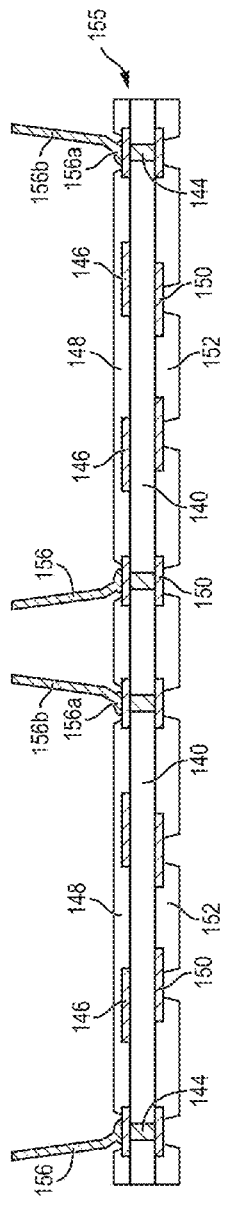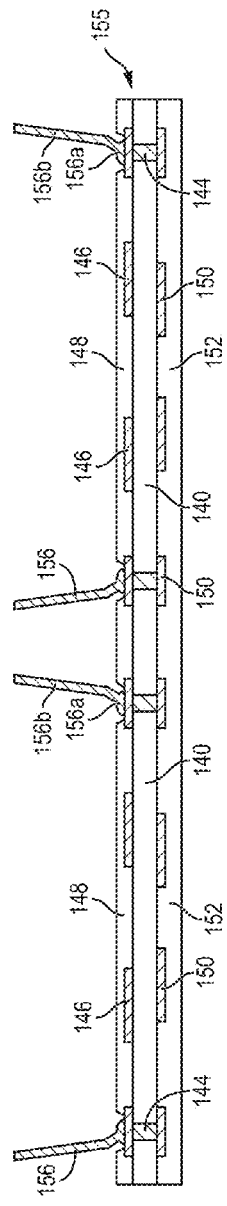

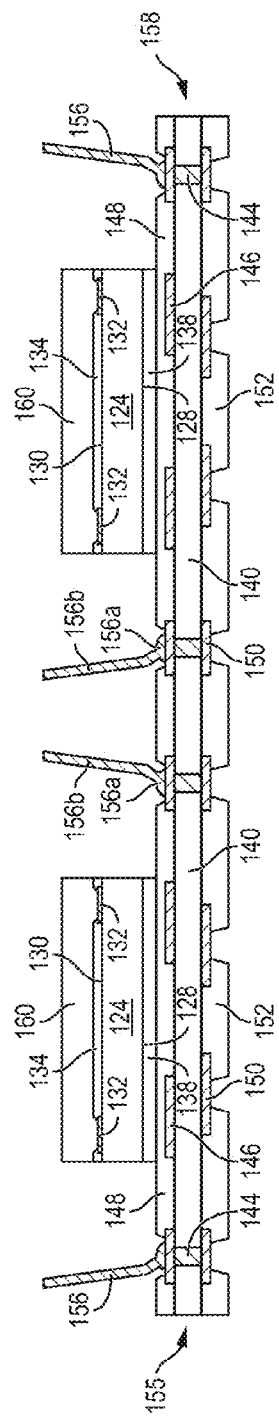
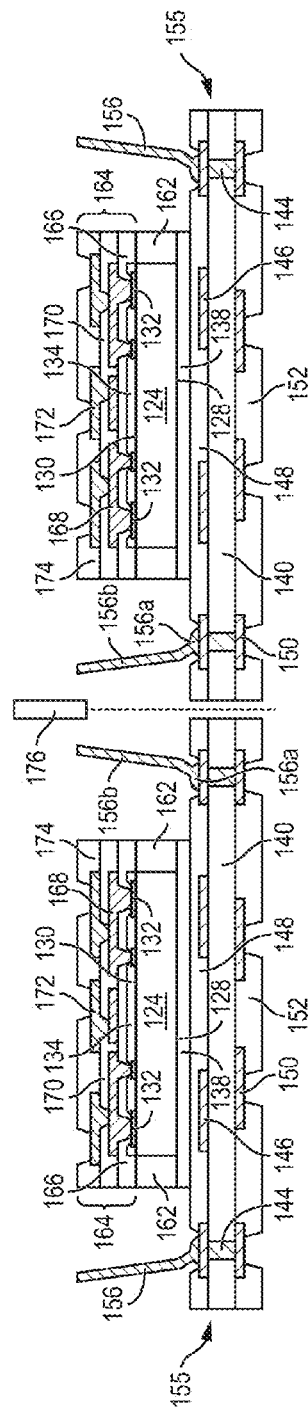

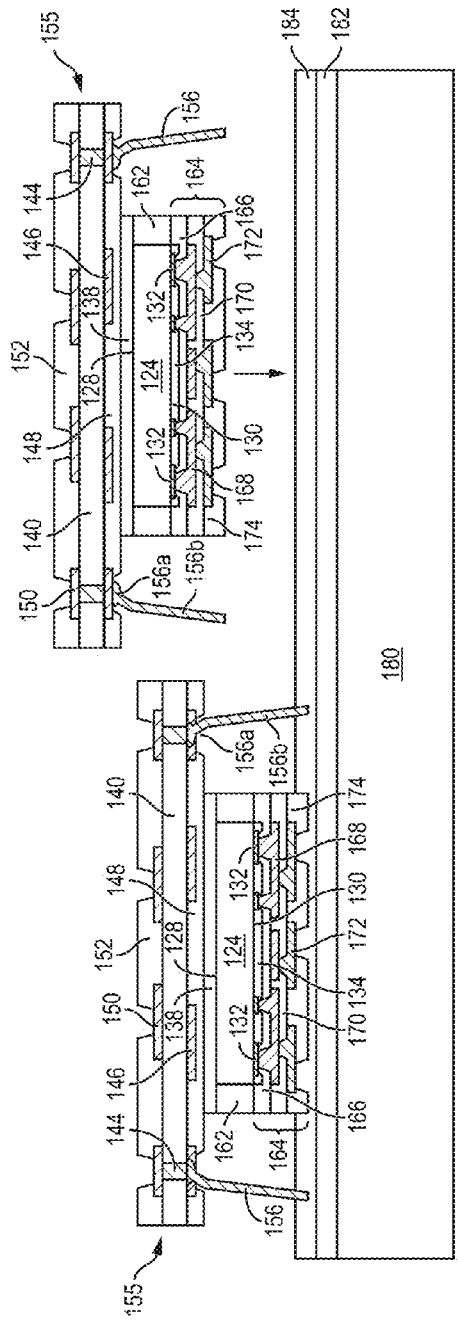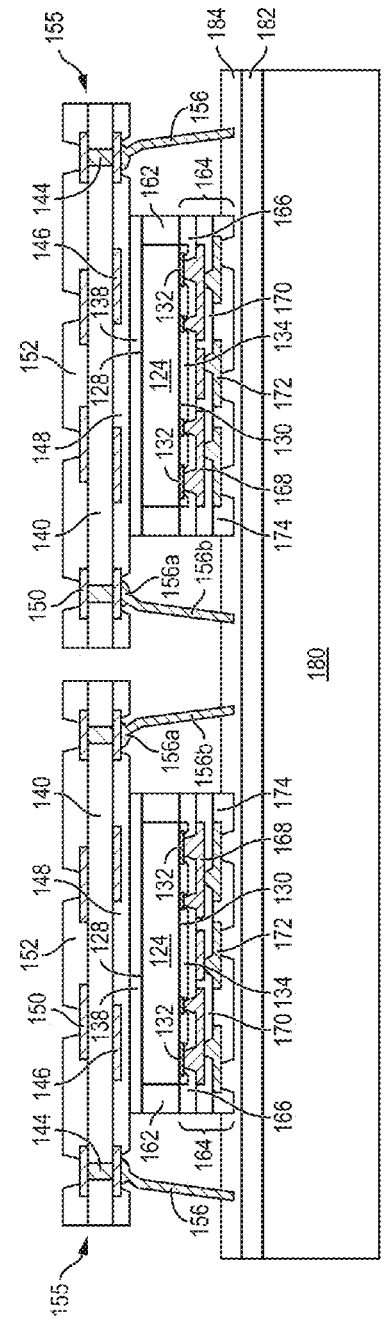
FIG. 5a
FIG. 5b

SEMICONDUCTOR DEVICE AND METHOD OF FORMING DUAL-SIDED INTERCONNECT STRUCTURES IN FO-WLCSP

CLAIM TO DOMESTIC PRIORITY

The present application claims the benefit of U.S. Provisional Application No. 61/701,366, filed Sep. 14, 2012, which application is incorporated herein by reference.

CROSS REFERENCE TO RELATED APPLICATIONS

The present application is related to U.S. patent application Ser. No. 13/832,118, now U.S. Pat. No. 9,385,052, filed Mar. 15, 2013, entitled "Semiconductor Device and Method of Forming Build-up Interconnect Structure over Carrier for Testing at Interim stages." The present application is further related to U.S. patent application Ser. No. 13/832,205, filed Mar. 15, 2013, entitled "Semiconductor Device and Method of Forming Dual-Sided Interconnect Structures in Fo-WLCSP."

FIELD OF THE INVENTION

The present invention relates in general to semiconductor devices and, more particularly, to a semiconductor device and method of forming dual-sided interconnect structures in Fo-WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Semiconductor die often require a top and bottom build-up interconnect structure in a fan-out wafer level chip scale package (Fo-WLCSP) for electrical connection to external devices. The build-up interconnect structures are typically formed layer-by-layer on both sides of the Fo-WLCSP. The layer-by-layer formation of the build-up interconnect structures requires long cycle time and high manufacturing cost due to the industry standard temporary bonding processes. The temporary bonding can lower manufacturing yield and increase defects.

SUMMARY OF THE INVENTION

A need exists for a simple and cost effective dual-sided interconnect structure in a Fo-WLCSP. Accordingly, in one embodiment, the present invention is a method of making a semiconductor device comprising the steps of providing a substrate including first and second conductive layers formed over first and second opposing surfaces of the substrate, forming a plurality of wire studs over the substrate, mounting a semiconductor die to the substrate between the wire studs, forming a first interconnect structure over the semiconductor die, depositing a first encapsulant over the substrate, semiconductor die, and first interconnect structure, and forming a second interconnect structure over the first encapsulant and first interconnect structure and electrically coupled to the wire studs.

In another embodiment, the present invention is a method of making a semiconductor device comprising the steps of providing a substrate, forming a vertical interconnect structure over the substrate, mounting a semiconductor die to the substrate, forming a first interconnect structure over the semiconductor die, depositing a first encapsulant over the substrate and semiconductor die, and forming a second interconnect structure over the first encapsulant and first interconnect structure.

In another embodiment, the present invention is a method of making a semiconductor device comprising the steps of providing a first interconnect structure, providing a semiconductor die, forming a protection layer over the semiconductor die, mounting the semiconductor die to the first interconnect structure, forming a plurality of stud bumps over the first interconnect structure, depositing an encapsulant over the first interconnect structure and semiconductor die, removing the protection layer to expose the semiconductor die, and forming a second interconnect structure over the encapsulant and semiconductor die.

In another embodiment, the present invention is a semiconductor device comprising a substrate and vertical interconnect structure formed over the substrate. A semiconductor die is mounted to the substrate. A first interconnect structure is formed over the semiconductor die. A first encapsulant is deposited over the substrate and semiconductor die. A second interconnect structure is formed over the first encapsulant and first interconnect structure.

BRIEF DESCRIPTION OF THE DRAWINGS

FIGS. 3a-3e illustrate a semiconductor wafer with a plurality of semiconductor die separated by a saw street;

FIGS. 4a-4g illustrate a process of forming an interposer substrate with a semiconductor die mounted to the substrate;

FIGS. 5a-5h illustrate a process of forming a build-up interconnect structure and the interposer substrate as the dual-sided interconnect structures in a Fo-WLCSP;

DETAILED DESCRIPTION OF THE DRAWINGS

Figure 1:
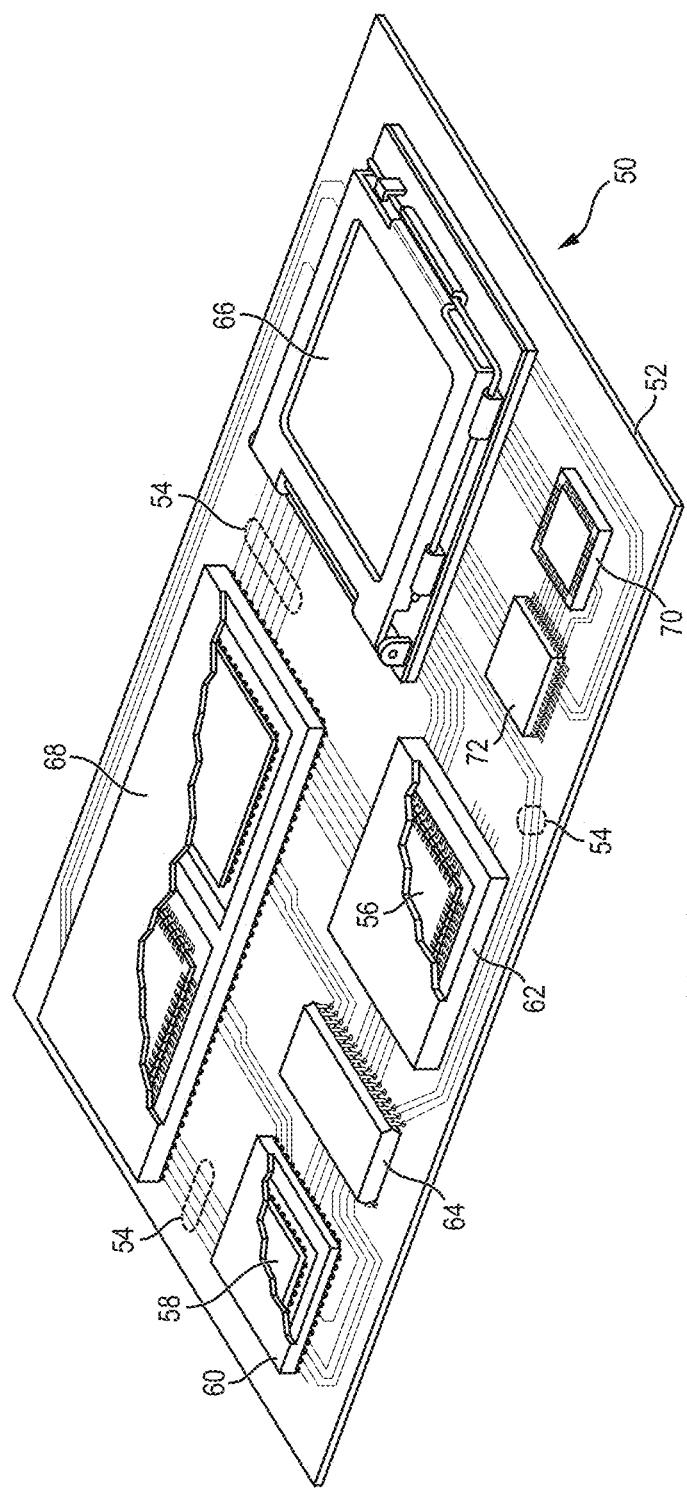
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and iflipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
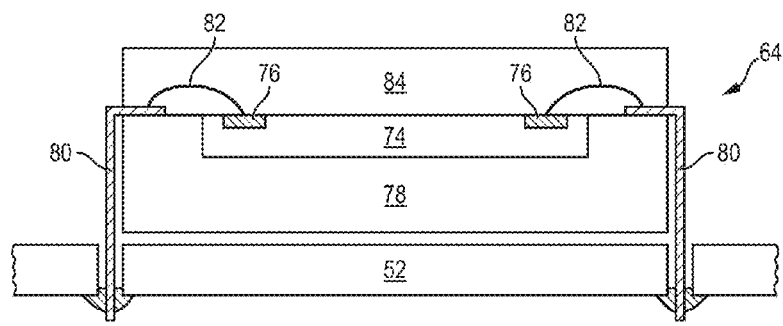
FIGS. 2a-2c illustrate further detail of the representative semiconductor packages mounted to the PCB.
Figure 2B:
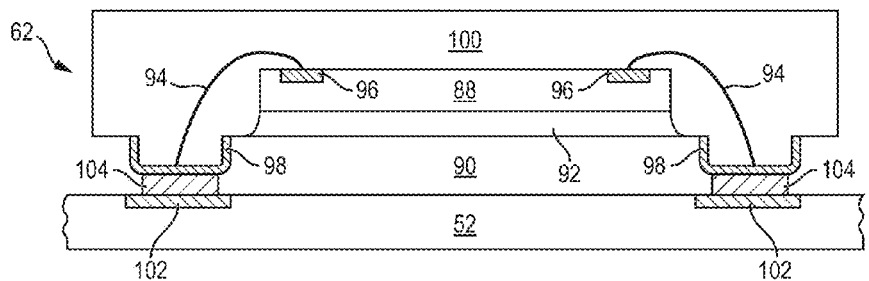
Figure 2C:
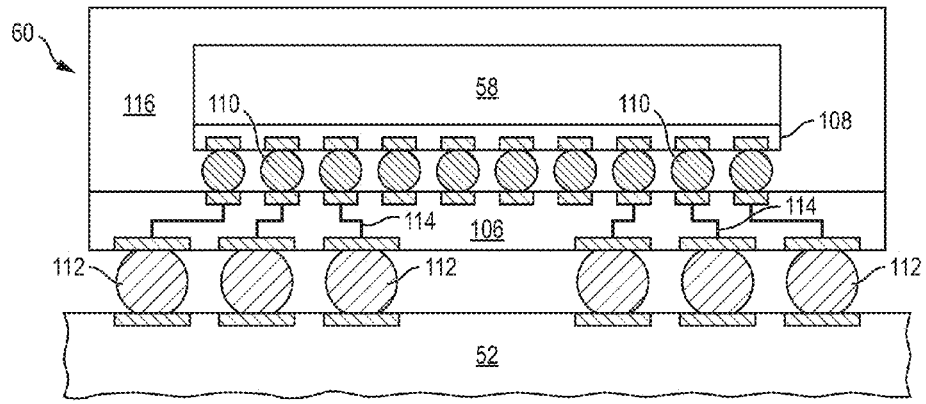

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar structural and insulating properties. A portion of insulating layer 134 is removed by laser direct ablation (LDA) using laser 136 to expose conductive layer 132. Alternatively, a portion of insulating layer 134 is removed by an etching process through a patterned photoresist layer to expose conductive layer 132.

In FIG. 3c, back surface 128 of semiconductor wafer 120 undergoes a backgrinding operation using grinder 137 followed by a polishing step to reduce the thickness of the wafer. In FIG. 3d, a die attach adhesive film or tape 138 is laminated to the polished back surface 128 prior to singulation.

In FIG. 3e, semiconductor wafer 120 is singulated through saw street 126 using a saw blade or laser cutting tool 139 into individual semiconductor die 124.

Figure 4D:
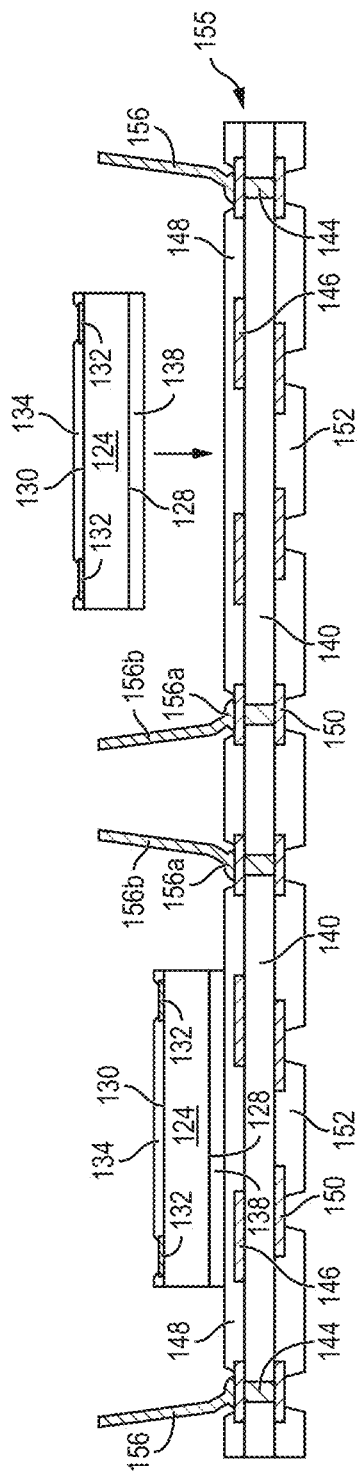

FIGS. 4a-4g illustrate formation of an interposer substrate with a semiconductor die mounted to the substrate. FIG. 4a shows a core substrate 140 including one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, core substrate 140 contains one or more insulating or dielectric layers.

A plurality of through vias is formed through core substrate 140 using laser drilling, mechanical drilling, or deep reactive ion etching (DRIE). The vias are filled with Al, Cu, Sn, Ni, Au, Ag, titanium (Ti), tungsten (W), or other suitable electrically conductive material using electrolytic plating, electroless plating process, or other suitable deposition process to form z-direction vertical interconnect conductive vias 144. In one embodiment, Cu is deposited over the sidewall of the through vias by electroless plating and electroplating. The through vias are filled with conductive paste or plugging resin with fillers.

An electrically conductive layer or redistribution layer (RDL) 146 is formed over a first surface of core substrate 140 and conductive vias 144 using a patterning and metal deposition process such as printing, PVD, CVD, sputtering, electrolytic plating, and electroless plating. Conductive layer 146 includes one or more layers of Al, Cu, Sn, Ni, Au, Ag, or other suitable electrically conductive material. Conductive layer 146 is electrically connected to conductive vias 144.

An insulating or passivation layer 148 is formed over the first surface of core substrate 140 and conductive layer 146 using PVD, CVD, printing, spin coating, spray coating, slit coating, rolling coating, lamination, sintering or thermal oxidation. The insulating layer 148 contains one or more layers of SiO2, Si3N4, SiON, Ta2O5, Al2O3, hafnium oxide (HfO2), benzocyclobutene (BCB), polyimide (PI), polybenzoxazoles (PBO), polymer dielectric resist with or without fillers or fibers, or other material having similar structural and dielectric properties. In another embodiment, insulating layer 148 is a masking layer.

An electrically conductive layer or RDL 150 is formed over a second surface of core substrate 140 opposite the first surface and conductive vias 144 using a patterning and metal deposition process such as printing, PVD, CVD, sputtering, electrolytic plating and electroless plating. Conductive layer 150 includes one or more layers of Al, Cu, Sn, Ni, Au, Ag, or other suitable electrically conductive material. Conductive layer 150 is electrically connected to conductive vias 144 and conductive layer 146. In another embodiment, conductive vias 144 are formed through core substrate 140 after forming conductive layer 146 and/or conductive layer 150.

An insulating or passivation layer 152 is formed over the second surface of core substrate 140 and conductive layer 150 using PVD, CVD, printing, spin coating, spray coating, slit coating, rolling coating, lamination, sintering or thermal oxidation. The insulating layer 152 contains one or more layers of SiO2, Si3N4, SiON, Ta2O5, Al2O3, HfO2, BCB, PI, PBO, polymer dielectric resist with or without fillers or fibers, or other material having similar structural and dielectric properties. In one embodiment, insulating layers 148 and 152 include a filler or fiber, such as silica, Al2O3, or glass fibers, for enhanced bending strength. A portion of insulating layer 152 is removed by LDA using laser 154 to expose conductive layer 150. In another embodiment, insulating layer 152 is a masking layer.

The resulting interposer substrate 155 provides electrical interconnect vertically and laterally across the substrate through conductive layers 146 and 150 and conductive vias 144 according to the electrical function of semiconductor die 124. Substrate 155 is inspected and tested to be known good by open/short probe or auto-scope inspection at an interim stage, i.e., prior to mounting semiconductor die 124. Portions of conductive layers 146 and 150 and conductive vias 144 are electrically common or electrically isolated according to the design and function of semiconductor die 124.

Substrate 155 can also be a multi-layer flexible laminate, ceramic, copper foil, glass, or semiconductor wafer including an active surface containing one or more transistors, diodes, and other circuit elements to implement analog circuits or digital circuits.

In FIG. 4b, wire studs 156 are attached to conductive layer 146 of substrate 155 by compression bonding, stitch bonding, ball bonding, or wedge bonding. Wire studs 156 compress upon contact with conductive layer 146 shown as base portion 156a. Stem 156b can be cut to the proper length, e.g., 250-500 μm. In one embodiment, wire studs 156 include Cu, Al, or metal alloy. Wire studs 156 provide a 3D vertical interconnect structure.

FIG. 4c shows an embodiment of substrate 155 with conductive layer 150 covered by insulating layer 152, i.e., conductive layer 150 is not exposed by LDA or etching process.

Figure 4E:
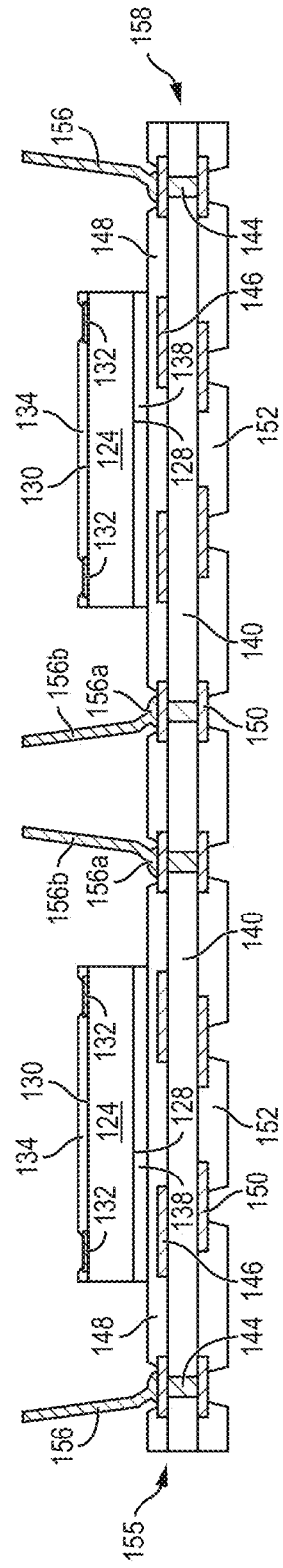

In FIG. 4d, semiconductor die 124 from FIG. 3c are mounted to interposer substrate 155 using, for example, a pick and place operation with back surface 128 oriented toward the substrate. Semiconductor die 124 are secured to insulating layer 148 of substrate 155 with die attach adhesive or film 138. FIG. 4e shows semiconductor die 124 mounted to substrate 155 as reconstituted wafer 158. Semiconductor die 124 is a known good die (KGD) having been tested prior to mounting to substrate 155. Substrate 155 has sufficient size to accommodate multiple semiconductor die.

In another embodiment, a protection layer 160, such as releasable dry film, dielectric resist or photoresist, is formed over insulating layer 134 and conductive layer 132, as show in FIG. 4f.

In another embodiment, an encapsulant 162 is deposited around semiconductor die 124. A build-up interconnect structure 164 is formed over insulating layer 134, conductive layer 132, and encapsulant 162, as shown in FIG. 4g. Build-up interconnect structure 164 includes insulating layer 166, conductive layer 168, insulating layer 170, conductive layer 172, and insulating layer 174. Build-up interconnect structure 164 is inspected and tested to be known good by open/short probe or auto-scope inspection at an interim stage, i.e., prior to singulation. The reconstituted wafer 158 is singulated through substrate 155 using saw blade or laser cutting tool 176 to separate semiconductor die 124.

Figure 5C:
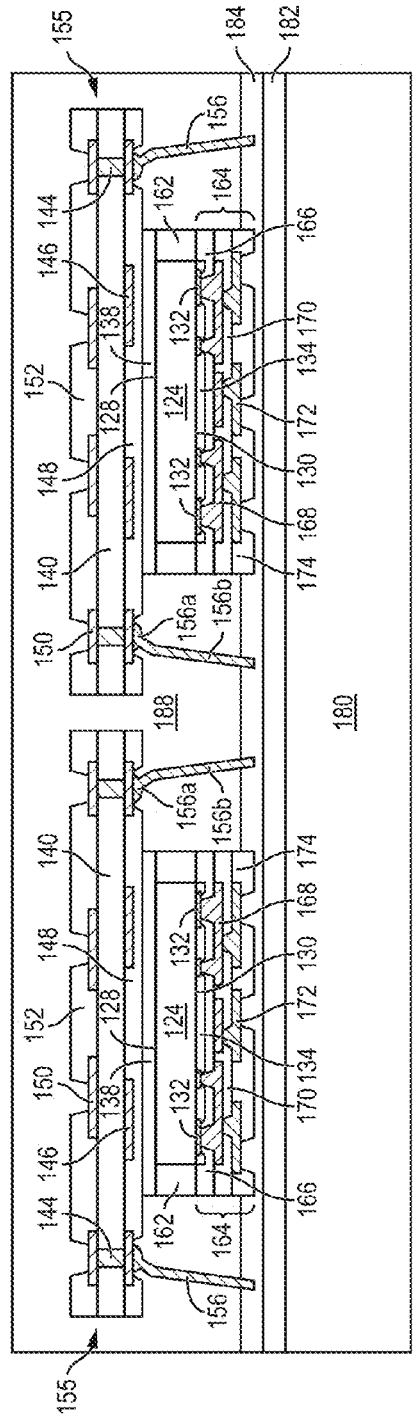

FIGS. 5a-5h illustrate, in relation to FIGS. 1 and 2a-2c, a process of forming a build-up interconnect structure and interposer substrate as the dual-sided interconnect structures in a Fo-WLCSP. FIG. 5a shows a carrier or temporary substrate 180 containing reusable or sacrificial base material such as silicon, polymer, beryllium oxide, glass, iron alloy or other suitable low-cost, rigid material for structural support. Carrier 180 can be round or rectangular. An interface layer or double-sided tape 182, including compressible adhesive releasing film 184, is formed over carrier 180 as a temporary adhesive bonding film, etch-stop layer, or thermal release layer. Semiconductor die 124, as mounted to substrate 140, are bonded to compressible adhesive releasing film 184 on carrier 180 with build-up interconnect structure 164 oriented toward the carrier. FIG. 5b shows semiconductor die 124 and substrate 140 mounted to carrier 180 with conductive layer 172 and insulating layer 174 embedded within compressible releasing film 184 on carrier 180. Carrier 180 has sufficient size to accommodate multiple semiconductor die 124.

In FIG. 5c, an encapsulant or molding compound 188 is deposited over and around carrier 180, substrate 155, semiconductor die 124, and wire studs 156 using a paste printing, compressive molding, transfer molding, liquid encapsulant molding, vacuum lamination, spin coating, or other suitable applicator. Encapsulant 188 can be polymer composite material, such as epoxy resin with filler, epoxy acrylate with filler, or polymer with proper filler. Encapsulant 188 is non-conductive and environmentally protects the semiconductor device from external elements and contaminants.

Figure 5D:
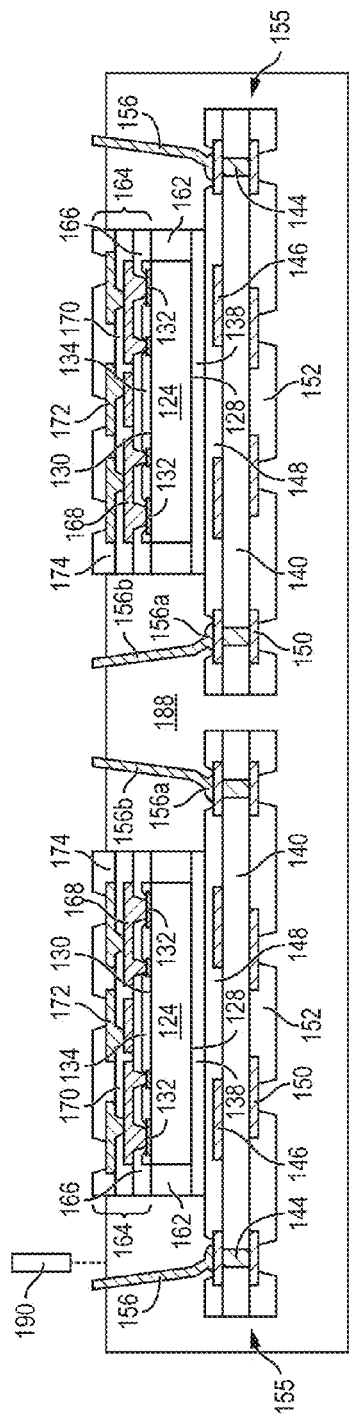

In FIG. 5d, carrier 180, interface layer 182, and compressible releasing film 184 are removed by chemical etching, mechanical peeling, chemical mechanical planarization (CMP), mechanical grinding, thermal bake, UV light, laser scanning, or wet stripping. Additional back grinding may be applied to control the warpage. A portion of encapsulant 188 is removed by LDA using laser 190 to expose wire studs 156 and conductive layer 172 and insulating layer 174 of build-up interconnect structure 164.

Figure 5E:
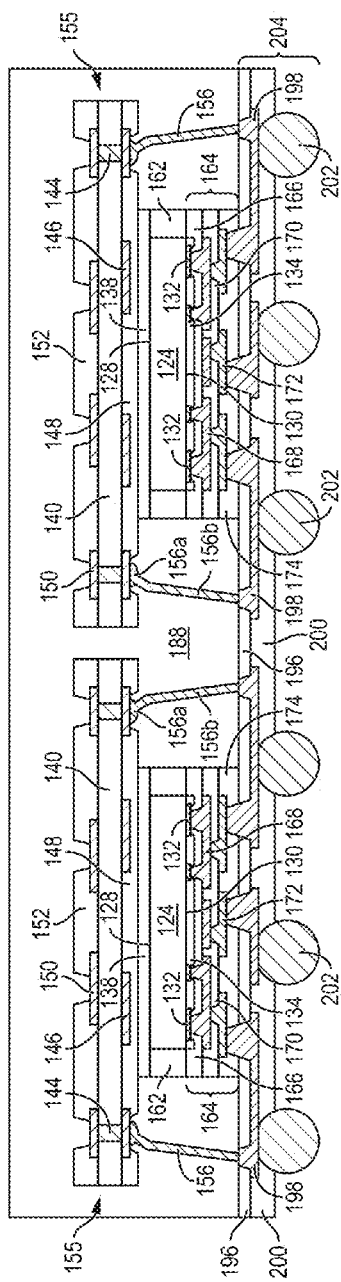

In FIG. 5e, an insulating or passivation layer 196 is formed over encapsulant 188, build-up interconnect structure 164, and the exposed wire stud 156 using PVD, CVD, printing, spin coating, spray coating, slit coating, rolling coating, lamination, sintering or thermal oxidation. The insulating layer 196 contains one or more layers of SiO2, Si3N4, SiON, Ta2O5, Al2O3, polymer dielectric resist with or without fillers or fibers, or other material having similar structural and insulating properties.

An electrically conductive layer or RDL 198 is formed over insulating layer 196, build-up interconnect structure 164, and the exposed wire stud 156 using a patterning and metal deposition process such as printing, PVD, CVD, sputtering, electrolytic plating and electroless plating. Conductive layer 198 includes one or more layers of Al, Cu, Ti, TiW, Sn, Ni, Au, Ag, or other suitable electrically conductive material. One portion of conductive layer 198 is electrically connected to conductive layer 172 of build-up interconnect structure 164. Another portion of conductive layer 198 is electrically connected to wire studs 156. Other portions of conductive layer 198 can be electrically common or electrically isolated depending on the design and function of semiconductor die 124.

An insulating or passivation layer 200 is formed over insulating layer 196 and conductive layer 198 using PVD, CVD, printing, spin coating, spray coating, slit coating, rolling coating, lamination, sintering or thermal oxidation. The insulating layer 200 contains one or more layers of SiO2, Si3N4, SiON, Ta2O5, Al2O3, polymer dielectric resist with or without fillers or fibers, or other material having similar structural and insulating properties. A portion of insulating layer 200 is removed by LDA or etching process through a patterned photoresist layer to expose conductive layer 198.

An electrically conductive bump material is deposited over conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form balls or bumps 202. In some applications, bumps 202 are reflowed a second time to improve electrical contact to conductive layer 198. In one embodiment, bumps 202 are formed over a UBM having a wetting layer, barrier layer, and adhesive layer. The bumps can also be compression bonded or thermocompression bonded to conductive layer 198. Bumps 202 represent one type of interconnect structure that can be formed over conductive layer 198. The interconnect structure can also use bond wires, conductive paste, stud bump, micro bump, or other electrical interconnect.

The combination of insulating layers 196 and 200 and conductive layer 198 and bumps 202 constitute a build-up interconnect structure 204. The build-up interconnect structures 204 are inspected and tested to be known good before additional device integration.

Figure 5F:
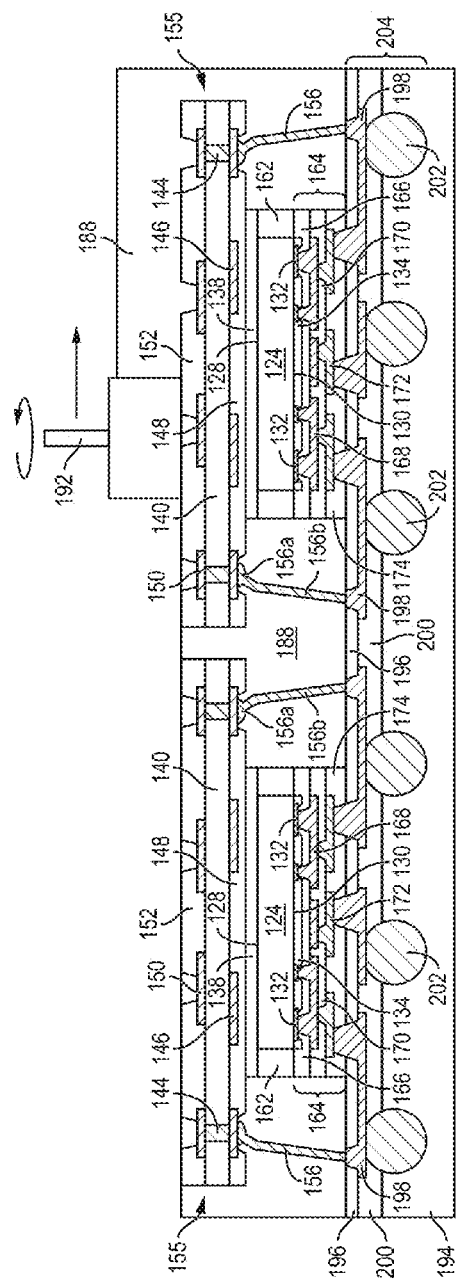
Figure 5G:
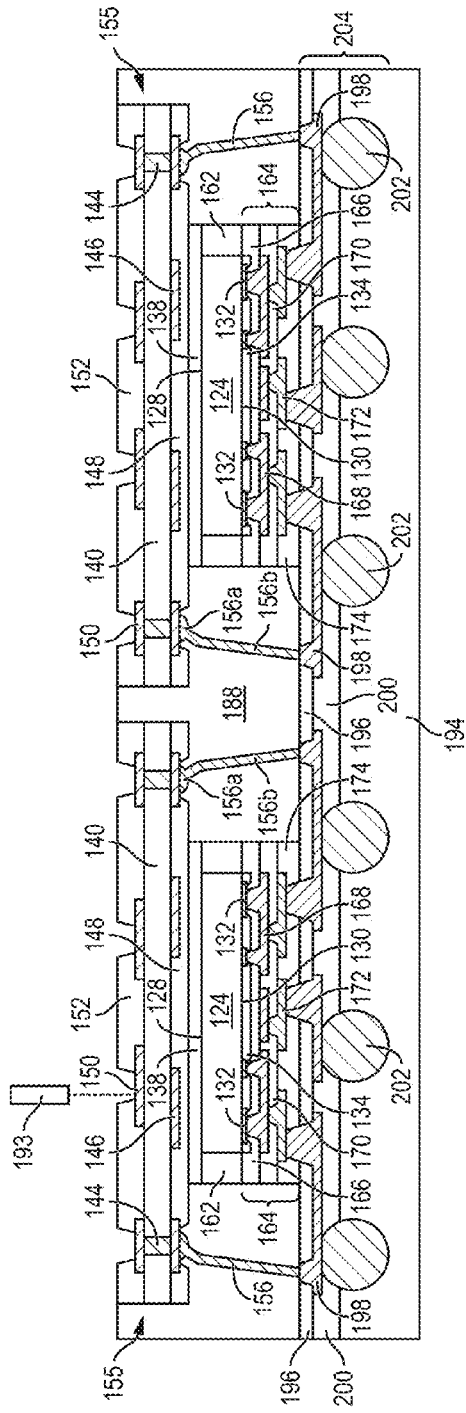

In FIG. 5f, a backgrinding or support tape 194 is applied over build-up interconnect structure 204. A portion of encapsulant 188 is removed in a grinding operation with grinder 192 to planarize the surface and expose insulating layer 152 of substrate 155. A chemical etch or CMP process can also be used to remove mechanical damage resulting from the grinding operation and planarize encapsulant 188. FIG. 5g shows substrate 155 after the grinding operation with any remaining encapsulant removed from conductive layer 150 and insulating layer 152 by laser 193 and/or stripping and cleaning processes.

Figure 5H:
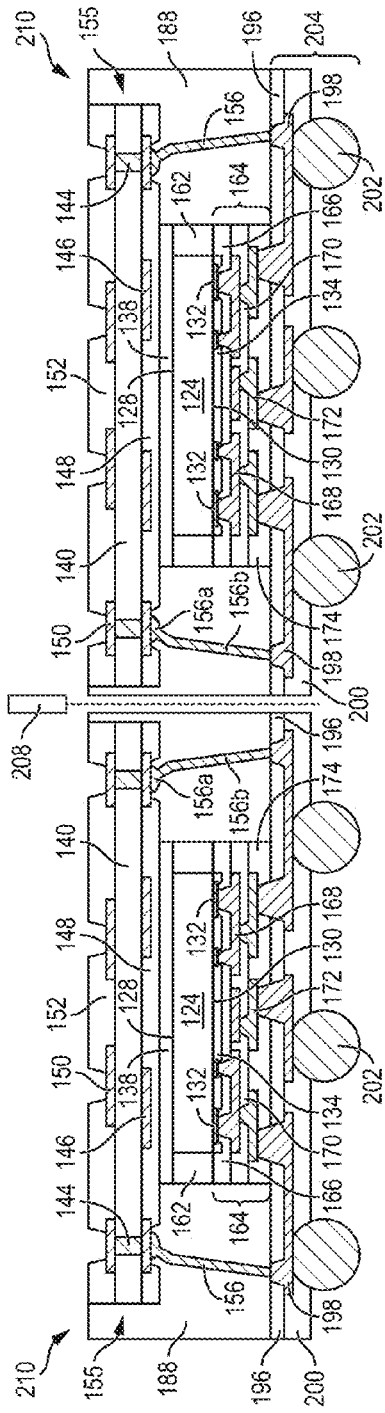
Figure 6:
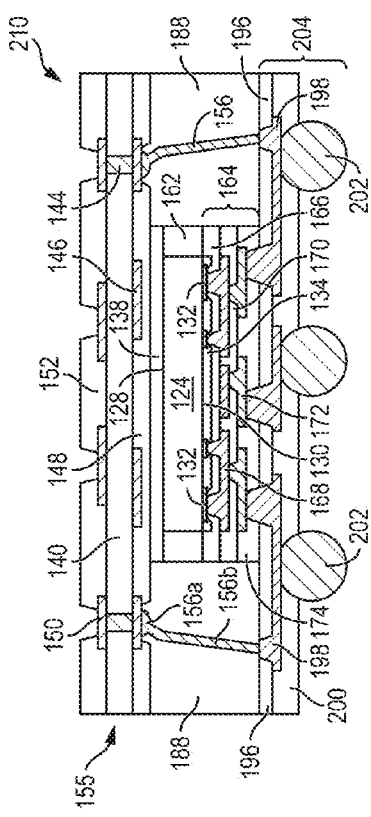
FIG. 6 illustrates the Fo-WLCSP with dual-sided interconnect structures according to FIGS. 5a-5h.

In FIG. 5h, backgrinding or support tape 194 is removed and semiconductor die 124 are singulated through encapsulant 188 and build-up interconnect structure 204 using saw blade or laser cutting tool 208 into individual dual-sided Fo-WLCSP 210. FIG. 6 shows Fo-WLCSP 210 after singulation. Semiconductor die 124 is electrically connected through build-up interconnect structure 164, build-up interconnect structure 204, and wire studs 156 to substrate 155 for connection to external devices. Substrate 155 and build-up interconnect structures 164 and 204 provide vertical and lateral interconnect for semiconductor die 124 on opposite sides (dual sides) of Fo-WLCSP 210. Substrate 155 is formed at a different time and separate from build-up interconnect structures 164 and 204. The formation and testing of substrate 155 prior to die mounting simplifies the manufacturing process and reduces cost. The later formation of build-up interconnect structures 164 and 204 with wire studs 156 providing vertical interconnect between substrate 155 and the build-up interconnect structures completes the vertical and lateral interconnect for semiconductor die 124 on opposite sides of Fo-WLCSP 210.

Figure 7A:
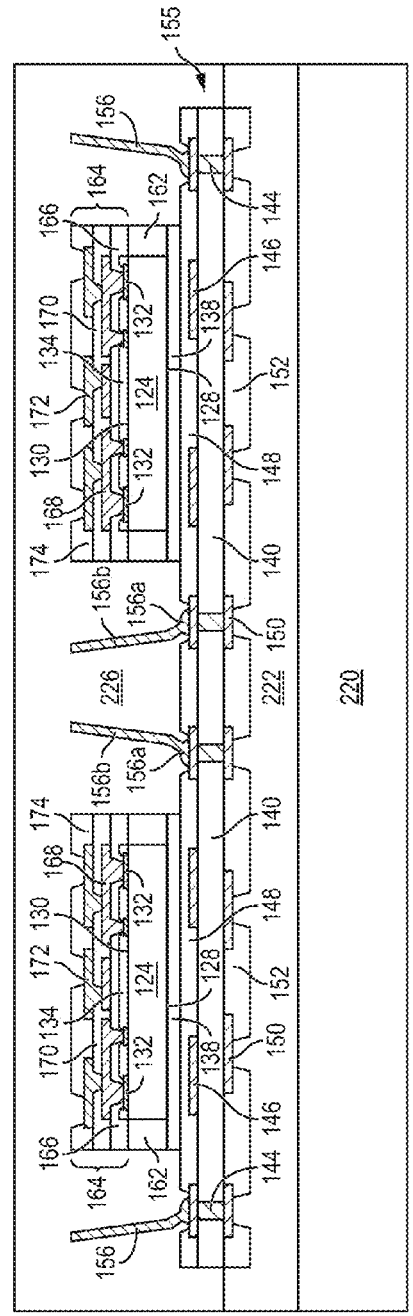
FIGS. 7a-7d illustrate another process of forming a build-up interconnect structure and the interposer substrate as the dual-sided interconnect structures in a Fo-WLCSP.

In another embodiment, continuing from FIG. 4g, semiconductor die 124 are mounted to carrier 220 with insulating layer 152 of substrate 140 oriented toward the carrier, as shown in FIG. 7a. Conductive layer 150 may be fully covered by insulating layer 152. A high temperature (greater than 200° C.) releasable bonding tape 222 is applied over carrier 220. Alternatively, a permanent dielectric bonding layer 222 with optional filler or fiber is applied over carrier 220. Conductive layer 146 and insulating layer 148 of substrate 140 are compressed into releasable bonding tape 222 on carrier 220. A protection layer, similar to protection layer 160 in FIG. 4f, may be formed over insulating layer 174 of build-up interconnect structure 164. Alternatively, insulating layer 174 may be dielectric material with fillers and having thickness greater than 25 μm.

An encapsulant or molding compound 226 is deposited over carrier 220, substrate 155, semiconductor die 124, and wire studs 156 using a paste printing, compressive molding, transfer molding, liquid encapsulant molding, vacuum lamination, spin coating, or other suitable applicator. Encapsulant 226 can be polymer composite material, such as epoxy resin with filler, epoxy acrylate with filler, or polymer with proper filler. Encapsulant 226 is non-conductive and environmentally protects the semiconductor device from external elements and contaminants.

Figure 7B:
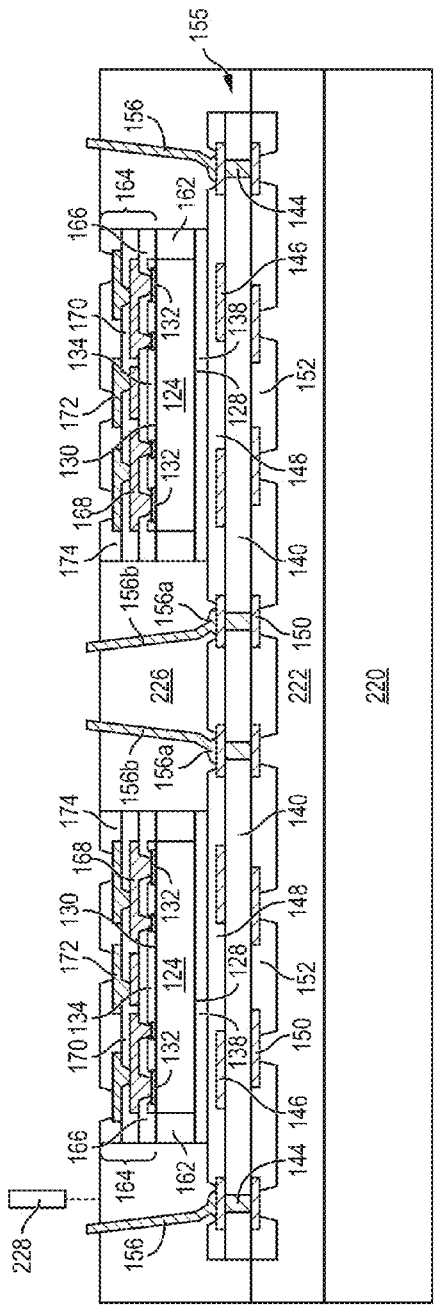

In FIG. 7b, a portion of encapsulant 226 is removed by LDA using laser 228 to expose wire studs 156 and conductive layer 172 and insulating layer 174 of build-up interconnect structure 164.

Figure 7C:
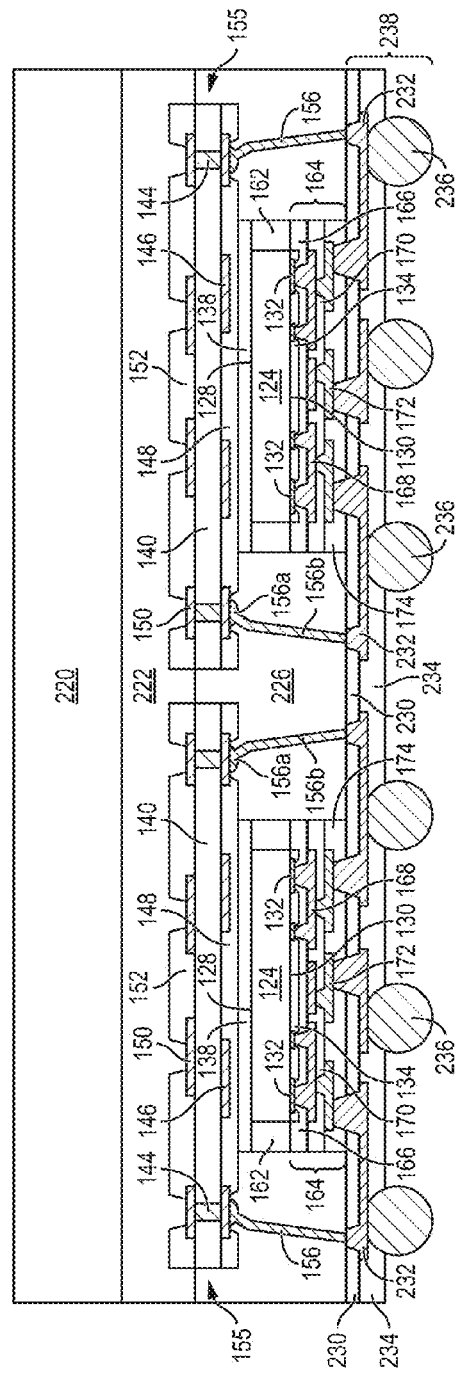

In FIG. 7c, an insulating or passivation layer 230 is formed over encapsulant 226, build-up interconnect structure 164, and the exposed wire stud 156 using PVD, CVD, printing, spin coating, spray coating, slit coating, rolling coating, lamination, sintering or thermal oxidation. The insulating layer 230 contains one or more layers of SiO2, Si3N4, SiON, Ta2O5, Al2O3, polymer dielectric resist with or without fillers or fibers, or other material having similar structural and insulating properties.

An electrically conductive layer or RDL 232 is formed over insulating layer 230, build-up interconnect structure 164, and the exposed wire stud 156 using a patterning and metal deposition process such as printing, PVD, CVD, sputtering, electrolytic plating and electroless plating. Conductive layer 232 includes one or more layers of Al, Cu, Ti, TiW, Sn, Ni, Au, Ag, or other suitable electrically conductive material. One portion of conductive layer 232 is electrically connected to conductive layer 172 of build-up interconnect structure 164. Another portion of conductive layer 232 is electrically connected to wire studs 156. Other portions of conductive layer 232 can be electrically common or electrically isolated depending on the design and function of semiconductor die 124.

An insulating or passivation layer 234 is formed over insulating layer 230 and conductive layer 232 using PVD, CVD, printing, spin coating, spray coating, slit coating, rolling coating, lamination, sintering or thermal oxidation. The insulating layer 234 contains one or more layers of SiO2, Si3N4, SiON, Ta2O5, Al2O3, polymer dielectric resist with or without fillers or fibers, or other material having similar structural and insulating properties. A portion of insulating layer 234 is removed by LDA or etching process through a patterned photoresist layer to expose conductive layer 232.

An electrically conductive bump material is deposited over conductive layer 232 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 232 using a suitable attachment or bonding process. In one embodiment, the bump material is reflowed by heating the material above its melting point to form balls or bumps 236. In some applications, bumps 236 are reflowed a second time to improve electrical contact to conductive layer 232. In one embodiment, bumps 236 are formed over a UBM having a wetting layer, barrier layer, and adhesive layer. The bumps can also be compression bonded or thermocompression bonded to conductive layer 232. Bumps 236 represent one type of interconnect structure that can be formed over conductive layer 232. The interconnect structure can also use bond wires, conductive paste, stud bump, micro bump, or other electrical interconnect.

The combination of insulating layers 230 and 234 and conductive layer 232 and bumps 236 constitute a build-up interconnect structure 238. The build-up interconnect structures 238 are inspected and tested to be known good before additional device integration.

Figure 7D:
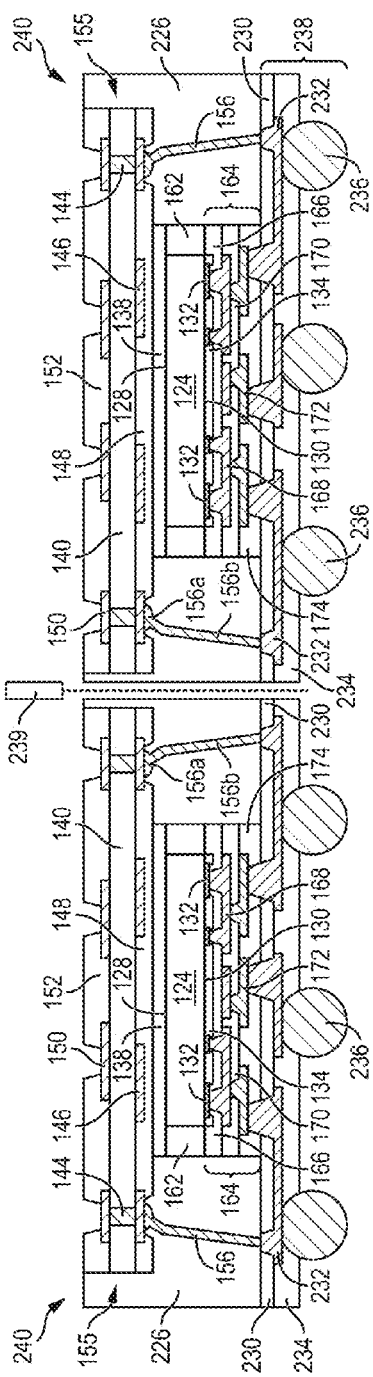
Figure 8:
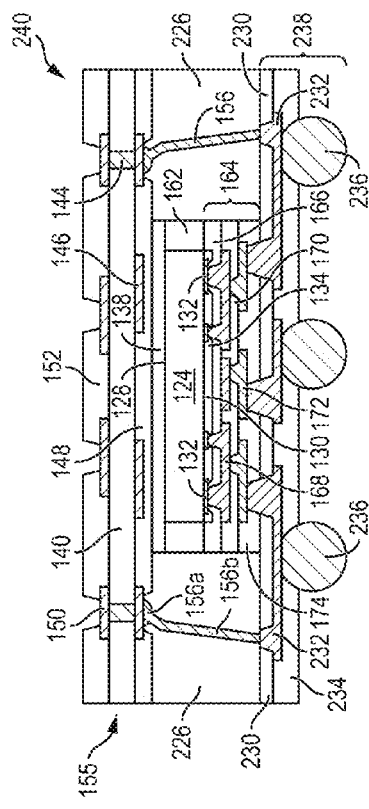
FIG. 8 illustrates the Fo-WLCSP with dual-sided interconnect structures according to FIGS. 7a-7d.

In FIG. 7d, carrier 220 and releasable bonding tape 222 are removed by chemical etching, mechanical peeling, CMP, mechanical grinding, thermal bake, UV light, laser scanning, or wet stripping. Carrier 220 may be partially removed in case of permanent bonding material 222. Semiconductor die 124 are singulated through encapsulant 226 and build-up interconnect structure 238 using saw blade or laser cutting tool 239 into individual dual-sided Fo-WLCSP 240. FIG. 8 shows Fo-WLCSP 240 after singulation. Semiconductor die 124 is electrically connected through build-up interconnect structure 164, build-up interconnect structure 238, and wire studs 156 to substrate 155 for connection to external devices. Substrate 155 and build-up interconnect structures 164 and 238 provide vertical and lateral interconnect for semiconductor die 124 on opposite sides (dual sides) of Fo-WLCSP 240. Substrate 155 is formed at a different time and separate from build-up interconnect structures 164 and 238. The formation and testing of substrate 155 prior to die mounting simplifies the manufacturing process and reduces cost. The later formation of build-up interconnect structures 164 and 238 with wire studs 156 providing vertical interconnect between substrate 155 and the build-up interconnect structures completes the vertical and lateral interconnect for semiconductor die 124 on opposite sides of Fo-WLCSP 240.

Figures 9A, 9B:
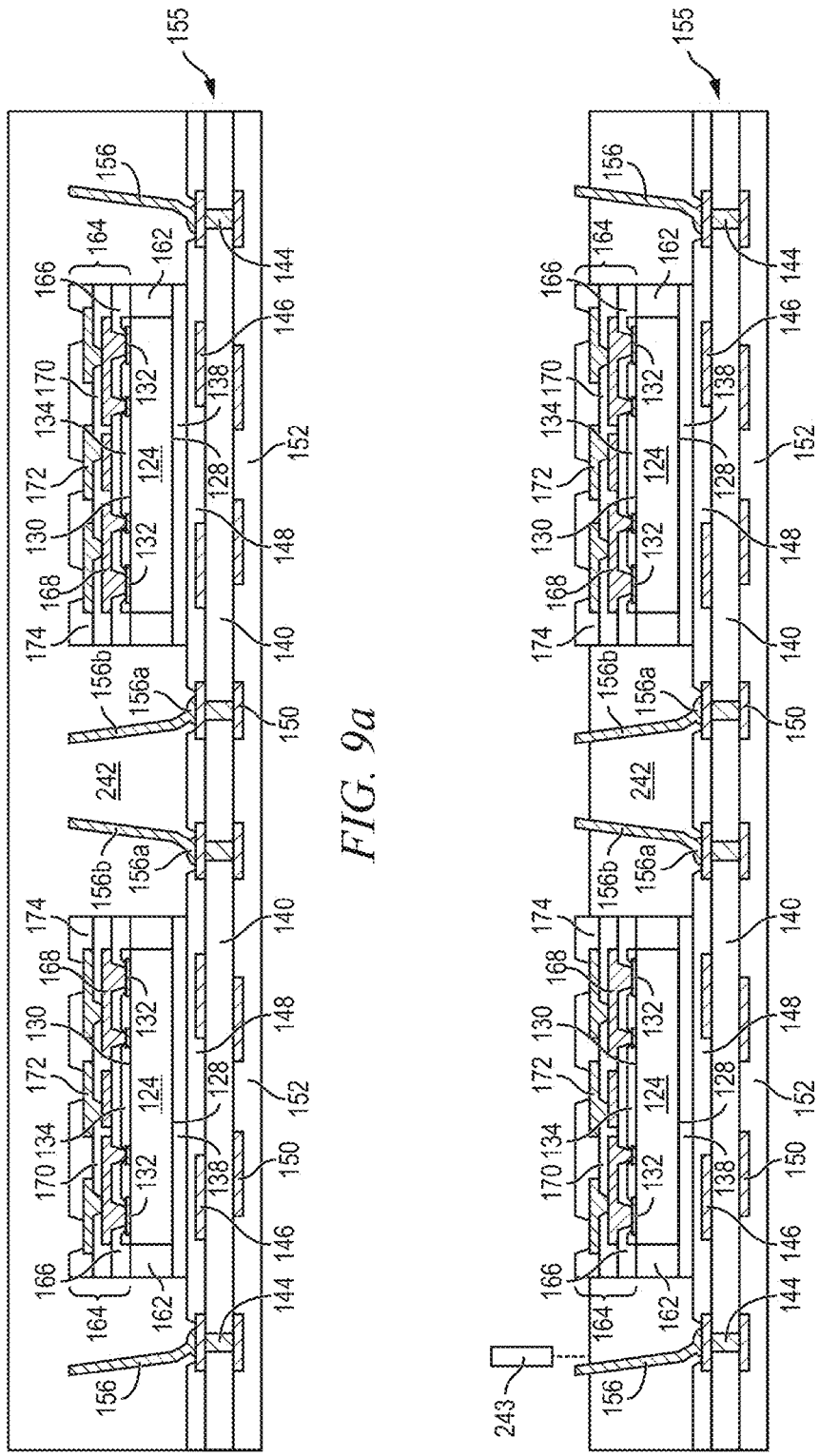
FIGS. 9a-9d illustrate another process of forming a build-up interconnect structure and the interposer substrate as the dual-sided interconnect structures in a Fo-WLCSP.

In another embodiment, continuing from FIG. 4g, substrate 155 remains unsingulated (see FIG. 4c) with semiconductor die 124 mounted to the substrate, as shown in FIG. 9a. An encapsulant or molding compound 242 is deposited over substrate 155, semiconductor die 124, and wire studs 156.

In FIG. 9b, a portion of encapsulant 242 is removed by LDA using laser 243 to expose wire studs 156 and conductive layer 172 and insulating layer 174 of build-up interconnect structure 164.

Figure 9C:
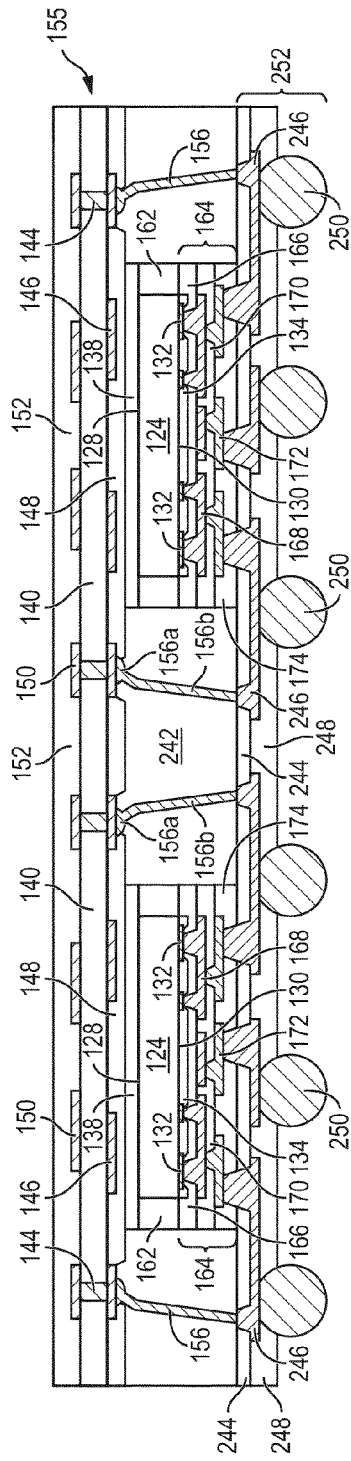

In FIG. 9c, an insulating or passivation layer 244 is formed over encapsulant 242, build-up interconnect structure 164, and the exposed wire stud 156 using PVD, CVD, printing, spin coating, spray coating, slit coating, rolling coating, lamination, sintering or thermal oxidation. The insulating layer 244 contains one or more layers of SiO2, Si3N4, SiON, Ta2O5, Al2O3, polymer dielectric resist with or without fillers or fibers, or other material having similar structural and insulating properties.

An electrically conductive layer or RDL 246 is formed over insulating layer 244, build-up interconnect structure 164, and the exposed wire stud 156 using a patterning and metal deposition process such as printing, PVD, CVD, sputtering, electrolytic plating and electroless plating. Conductive layer 246 includes one or more layers of Al, Cu, Sn, Ni, Au, Ag, or other suitable electrically conductive material. One portion of conductive layer 246 is electrically connected to conductive layer 172 of build-up interconnect structure 164. Another portion of conductive layer 246 is electrically connected to wire studs 156. Other portions of conductive layer 246 can be electrically common or electrically isolated depending on the design and function of semiconductor die 124.

An insulating or passivation layer 248 is formed over insulating layer 244 and conductive layer 246 using PVD, CVD, printing, spin coating, spray coating, slit coating, rolling coating, lamination, sintering or thermal oxidation. The insulating layer 248 contains one or more layers of SiO2, Si3N4, SiON, Ta2O5, Al2O3, polymer dielectric resist with or without fillers or fibers, or other material having similar structural and insulating properties. A portion of insulating layer 248 is removed by LDA or etching process through a patterned photoresist layer to expose conductive layer 246.

An electrically conductive bump material is deposited over conductive layer 246 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 246 using a suitable attachment or bonding process. In one embodiment, the bump material is reflowed by heating the material above its melting point to form balls or bumps 250. In some applications, bumps 250 are reflowed a second time to improve electrical contact to conductive layer 246. In one embodiment, bumps 250 are formed over a UBM having a wetting layer, barrier layer, and adhesive layer. The bumps can also be compression bonded or thermocompression bonded to conductive layer 246. Bumps 250 represent one type of interconnect structure that can be formed over conductive layer 246. The interconnect structure can also use bond wires, conductive paste, stud bump, micro bump, or other electrical interconnect.

The combination of insulating layers 244 and 248 and conductive layer 246 and bumps 250 constitute a build-up interconnect structure 252. The build-up interconnect structures 252 are inspected and tested to be known good before additional device integration.

Figure 9D:
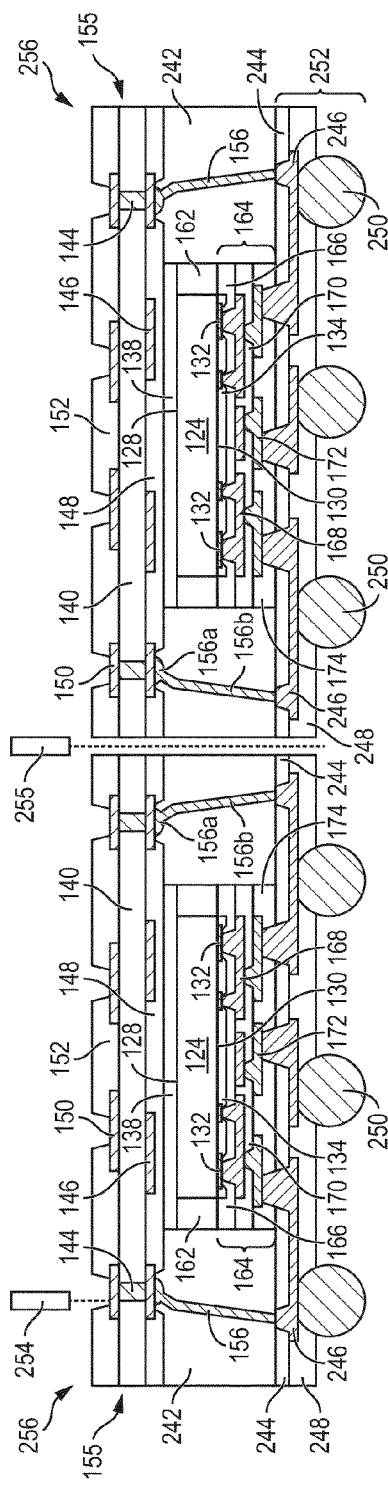
Figure 10:
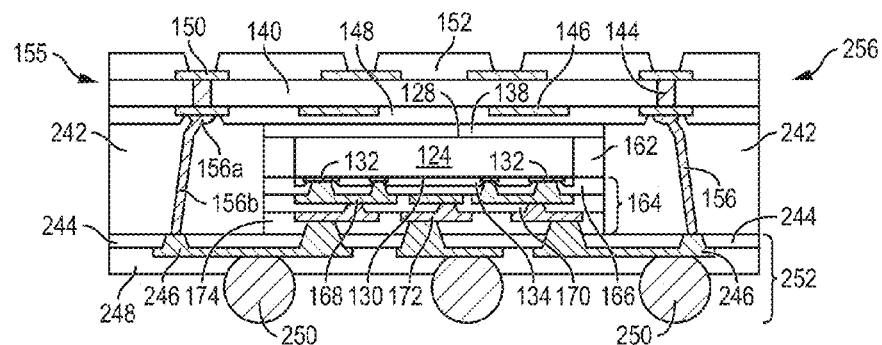
FIG. 10 illustrates the Fo-WLCSP with dual-sided interconnect structures according to FIGS. 9a-9d.

In FIG. 9d, a portion of insulating layer 152 is removed by LDA using laser 254 to expose conductive layer 150. Semiconductor die 124 are singulated through substrate 155, encapsulant 242, and build-up interconnect structure 252 using saw blade or laser cutting tool 255 into individual dual-sided Fo-WLCSP 256. FIG. 10 shows Fo-WLCSP 256 after singulation. Semiconductor die 124 are electrically connected through build-up interconnect structure 164, build-up interconnect structure 252, and wire studs 156 to substrate 155 for connection to external devices. Substrate 155 and build-up interconnect structures 164 and 252 provide vertical and lateral interconnect for semiconductor die 124 on opposite sides (dual sides) of Fo-WLCSP 256. Substrate 155 is formed at a different time and separate from build-up interconnect structures 164 and 252. The formation and testing of substrate 155 prior to die mounting simplifies the manufacturing process and reduces cost. The later formation of build-up interconnect structures 164 and 252 with wire studs 156 providing vertical interconnect between substrate 155 and the build-up interconnect structures completes the vertical and lateral interconnect for semiconductor die 124 on opposite sides of Fo-WLCSP 256.

Figure 11:
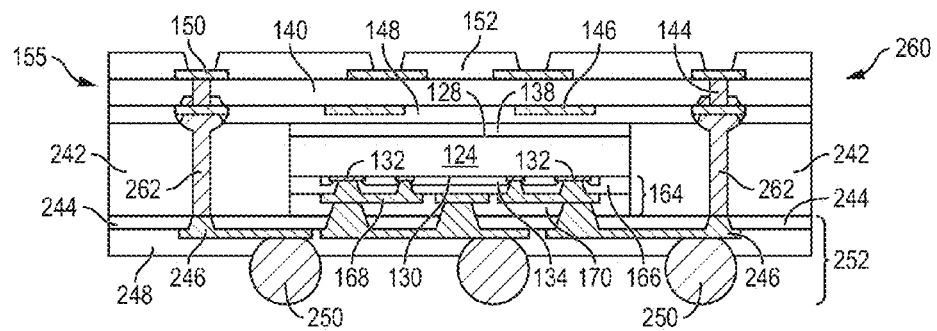
FIG. 11 illustrates the Fo-WLCSP with stud bumps between the dual-sided interconnect structures.

FIG. 11 illustrates an embodiment of Fo-WLCSP 260, similar to FIG. 10, with stud bumps 262 disposed between substrate 155 and build-up interconnect structure 252. Stud bumps 262 electrically connect conductive layer 146 of substrate 155 to conductive layer 246 of build-up interconnect structure 252. Build-up interconnect structure 164 includes at least one RDL layer, e.g., conductive layer 168.

Figure 12:
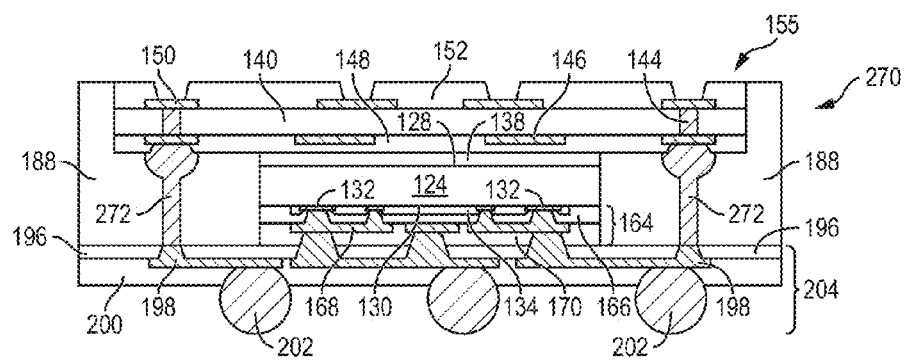
FIG. 12 illustrates the Fo-WLCSP with encapsulant extending along the sides of the interposer substrate.

FIG. 12 illustrates an embodiment of Fo-WLCSP 270, similar to FIGS. 5a-5h, with stud bumps 272 disposed between substrate 155 and build-up interconnect structure 204. Stud bumps 272 electrically connect conductive layer 146 of substrate 155 to conductive layer 198 of build-up interconnect structure 204. Encapsulant 188 extends along side surfaces of substrate 155 to an upper surface of insulating layer 152. Build-up interconnect structure 164 includes at least one RDL layer, e.g., conductive layer 168.

Figure 13:
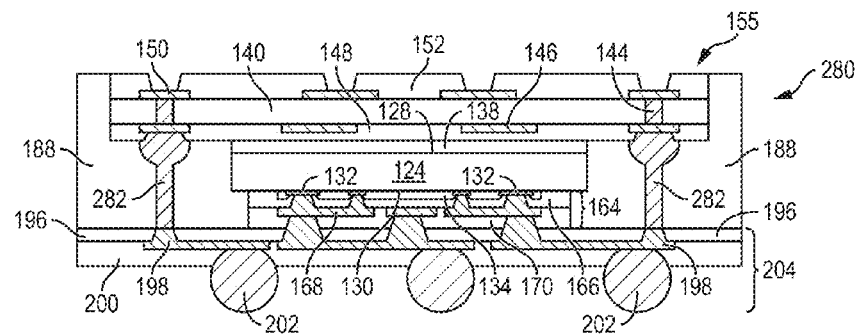
FIG. 13 illustrates the Fo-WLCSP with the encapsulant disposed on a portion of the active surface of the semiconductor die.

FIG. 13 illustrates an embodiment of Fo-WLCSP 280, similar to FIGS. 5a-5h, with stud bumps 282 disposed between substrate 155 and build-up interconnect structure 204. Stud bumps 282 electrically connect conductive layer 146 of substrate 155 to conductive layer 198 of build-up interconnect structure 204. Encapsulant 188 extends along side surfaces of substrate 155 to an upper surface of insulating layer 152. Encapsulant 188 covers side surfaces of semiconductor die 124 and a portion of active surface 130 of the semiconductor die.

Figure 14:
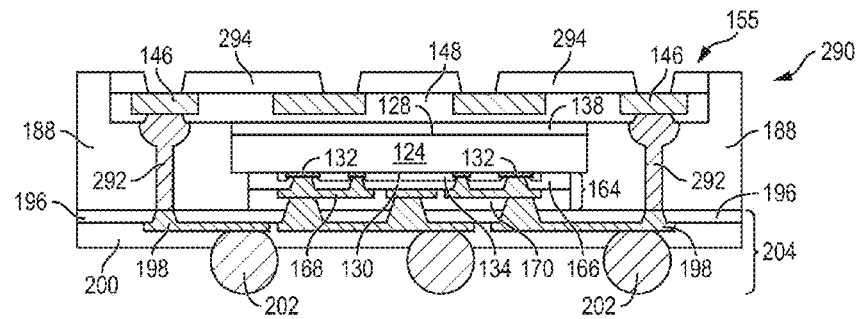
FIG. 14 illustrates the Fo-WLCSP with a masking layer over the interconnect structure.

FIG. 14 illustrates an embodiment of Fo-WLCSP 290, similar to FIGS. 5a-5h, with stud bumps 292 disposed between substrate 155 and build-up interconnect structure 204. Stud bumps 292 electrically connect conductive layer 146 of substrate 155 to conductive layer 198 of build-up interconnect structure 204. Encapsulant 188 covers side surfaces of semiconductor die 124 and a portion of active surface 130 of the semiconductor die. Substrate 155 is removed and replaced with masking layer 294. A portion of masking layer 294 is removed by LDA or etching process through a patterned photoresist layer to expose conductive layer 146.

Figure 15:
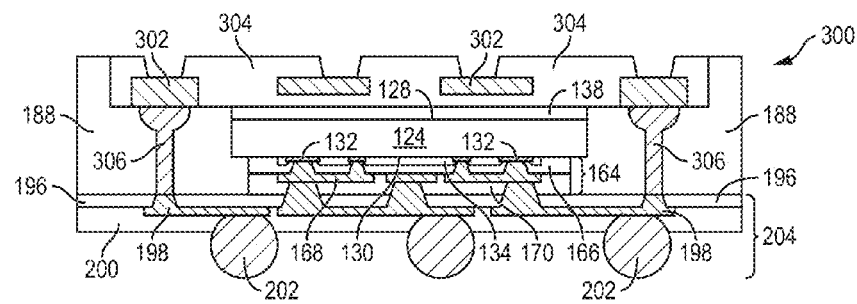
FIG. 15 illustrates the Fo-WLCSP with a leadframe as an interconnect structure.

FIG. 15 illustrates an embodiment of Fo-WLCSP 300, similar to FIGS. 5a-5h, with leadframe 302 embedded within encapsulant 304. Stud bumps 306 are disposed between leadframe 302 and build-up interconnect structure 204. Encapsulant 188 covers side surfaces of semiconductor die 124 and a portion of active surface 130 of the semiconductor die. A portion of encapsulant 304 is removed by LDA or etching process through a patterned photoresist layer to expose leadframe 302.

Figure 16A:
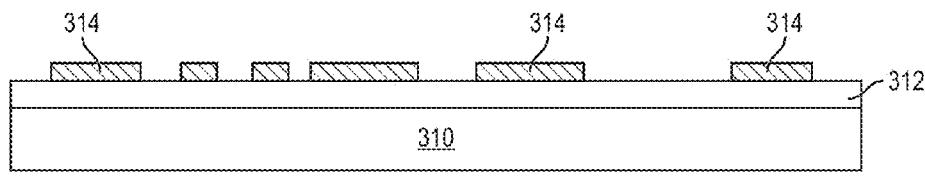
FIGS. 16a-16f illustrate a process of forming top and bottom build-up interconnect structures in a Fo-WLCSP.

FIGS. 16a-16f illustrate, in relation to FIGS. 1 and 2a-2c, a process of forming top and bottom build-up interconnect structures in a Fo-WLCSP. FIG. 16a shows a carrier or temporary substrate 310 containing sacrificial base material such as silicon, polymer, beryllium oxide, glass, or other suitable low-cost, rigid material for structural support.

An insulating or passivation layer 312 is formed over carrier 310 using PVD, CVD, printing, spin coating, spray coating, slit coating, rolling coating, lamination, sintering or thermal oxidation. The insulating layer 312 contains one or more layers of SiO2, Si3N4, SiON, Ta2O5, Al2O3, polymer dielectric resist with or without fillers or fibers, or other material having similar structural and insulating properties. In one embodiment, insulating layer 312 includes a glass cloth, glass cross, filler, or fiber, such as silica, Al2O3, or glass fibers, for enhanced bending strength.

An electrically conductive layer or RDL 314 is formed over insulating layer 312 using a patterning and metal deposition process such as Cu foil lamination, printing, PVD, CVD, sputtering, electrolytic plating and electroless plating. Conductive layer 314 includes one or more layers of Al, Cu, Sn, Ni, Au, Ag, or other suitable electrically conductive material. In one embodiment, conductive layer 314 is Cu foil patterned with photo resist or ink printing. Alternatively, conductive layer 314 includes Ti (TiW)/Cu seed layer followed by lithography and selective plating. Portions of conductive layer 314 can be electrically common or electrically isolated depending on the design and function of the semiconductor die.

Figure 16B:
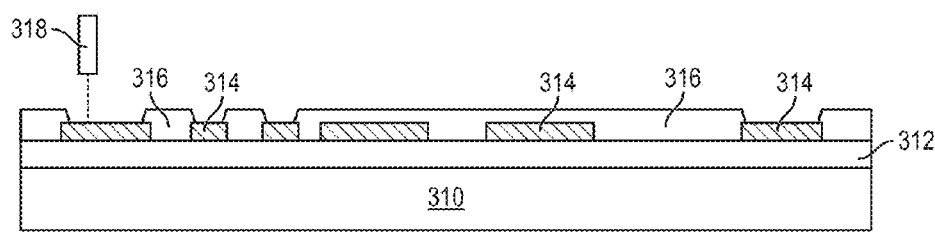

In FIG. 16b, an insulating or passivation layer 316 is formed over insulating layer 312 and conductive layer 314 using PVD, CVD, printing, spin coating, spray coating, slit coating, rolling coating, lamination, sintering or thermal oxidation. The insulating layer 316 contains one or more layers of SiO2, Si3N4, SiON, Ta2O5, Al2O3, polymer dielectric resist with or without fillers or fibers, or other material having similar structural and insulating properties. In one embodiment, insulating layer 316 includes a glass cloth, glass cross, filler, or fiber, such as silica, Al2O3, or glass fibers, for enhanced bending strength. A portion of insulating layer 316 is removed by LDA using laser 318 to expose conductive layer 314. Alternatively, a portion of insulating layer 316 is removed by etching process through a patterned photoresist layer to expose conductive layer 314. Conductive layer 314 and insulating layer 316 are inspected and tested to be known good by open/short probe or autoscope inspection at an interim stage, i.e., prior to mounting semiconductor die 320.

Figure 16C:
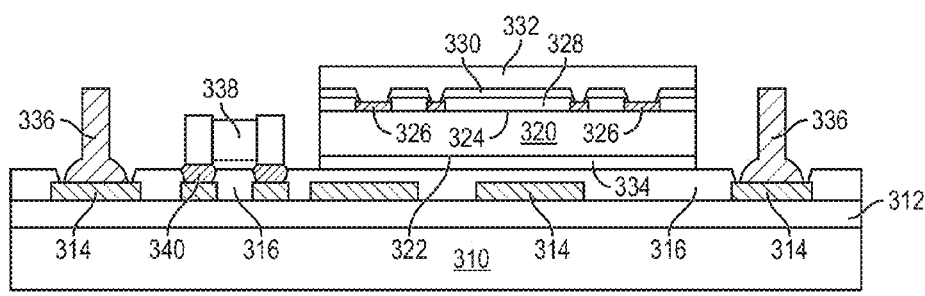

FIG. 16c shows semiconductor die 320, from a semiconductor wafer similar to FIG. 3a, with a back surface 322 and active surface 324 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 324 to implement analog circuits or digital circuits, such as DSP, ASIC, memory, or other signal processing circuit. Semiconductor die 320 may also contain IPDs, such as inductors, capacitors, and resistors, for RF signal processing.

An electrically conductive layer 326 is formed over active surface 324 using PVD, CVD, electrolytic plating, electroless plating process, or other suitable metal deposition process. Conductive layer 326 can be one or more layers of Al, Cu, Sn, Ni, Au, Ag, or other suitable electrically conductive material. Conductive layer 326 operates as contact pads electrically connected to the circuits on active surface 324.

An insulating or passivation layer 328 is formed over active surface 324 and conductive layer 326 using PVD, CVD, printing, spin coating, spray coating, slit coating, rolling coating, lamination, sintering or thermal oxidation. The insulating layer 328 contains one or more layers of SiO2, Si3N4, SiON, Ta2O5, Al2O3, polymer dielectric resist with or without fillers or fibers, or other material having similar structural and insulating properties. A portion of insulating layer 328 is removed by LDA or etching process through a patterned photoresist layer to expose conductive layer 326.

An insulating or passivation layer 330 is formed over insulating layer 328 and conductive layer 326 using PVD, CVD, printing, spin coating, spray coating, slit coating, rolling coating, lamination, sintering or thermal oxidation. The insulating layer 330 contains one or more layers of SiO2, Si3N4, SiON, Ta2O5, Al2O3, polymer material with or without fillers or fibers, or other material having similar structural and insulating properties. A portion of insulating layer 330 is removed by LDA or etching process through a patterned photoresist layer to expose conductive layer 326.

A protection layer 332 is formed over insulating layer 330 and conductive layer 326 using PVD, CVD, printing, spin coating, spray coating, slit coating, rolling coating, lamination, sintering or thermal oxidation. Protection layer 332 contains one or more layers of SiO2, Si3N4, SiON, Ta2O5, Al2O3, or other material having similar structural and insulating properties.

Semiconductor die 320 is mounted to insulating layer 316 with die attach adhesive 334, such as epoxy resin. Stud bumps 336 are formed over conductive layer 314. Discrete semiconductor device 338 is metallurgically and electrically coupled to conductive layer 314 using conductive paste 340. Discrete semiconductor device 338 can be an inductor, capacitor, resistor, transistor, or diode.

Figure 16D:
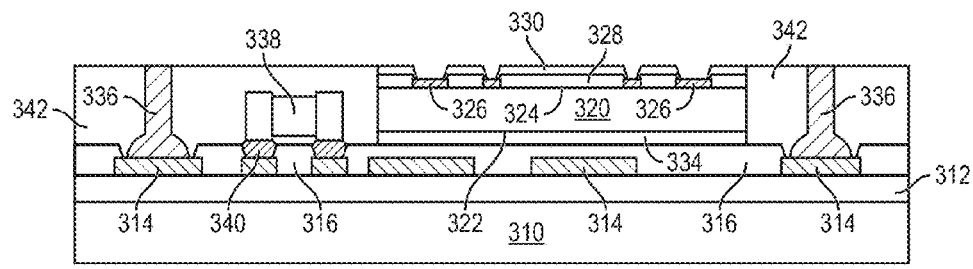

In FIG. 16d, an encapsulant or molding compound 342 is deposited over and around insulating layer 316, semiconductor die 320, stud bumps 336, and discrete semiconductor devices 338 using a paste printing, compressive molding, transfer molding, liquid encapsulant molding, vacuum lamination, spin coating, or other suitable applicator. Encapsulant 342 can be polymer composite material, such as epoxy resin with filler, epoxy acrylate with filler, or polymer with proper filler. Encapsulant 342 is non-conductive and environmentally protects the semiconductor device from external elements and contaminants.

Figure 16E:
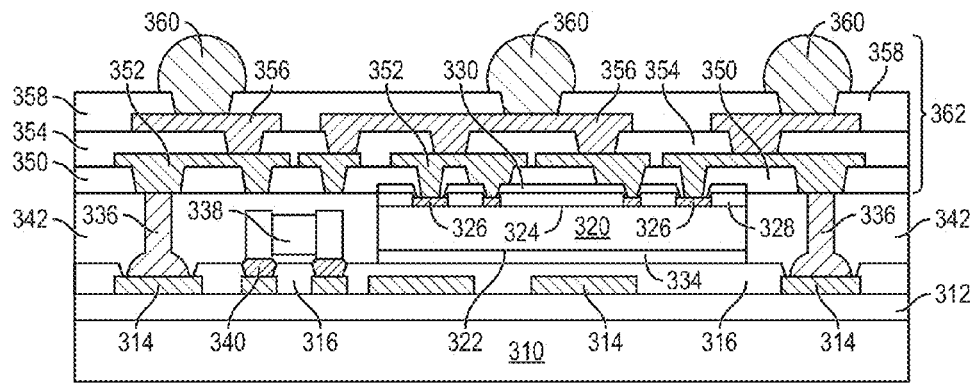

In FIG. 16e, protection layer 332 is removed to expose insulating layer 330 and conductive layer 326 in a shallow cavity in encapsulant 342. An insulating or passivation layer 350 is formed over semiconductor die 320, encapsulant 342, and stud bumps 336 using PVD, CVD, printing, spin coating, spray coating, slit coating, rolling coating, lamination, sintering or thermal oxidation. The insulating layer 350 contains one or more layers of SiO2, Si3N4, SiON, Ta2O5, Al2O3, polymer dielectric resist with or without fillers or fibers, or other material having similar structural and insulating properties. A portion of insulating layer 350 is removed by LDA or etching process through a patterned photoresist layer to expose conductive layer 326 and stud bumps 336.

An electrically conductive layer or RDL 352 is formed over insulating layer 350 and stud bumps 336 using a patterning and metal deposition process such as printing, PVD, CVD, sputtering, electrolytic plating and electroless plating. Conductive layer 352 includes one or more layers of Al, Cu, Sn, Ni, Au, Ag, or other suitable electrically conductive material. One portion of conductive layer 352 is electrically connected to conductive layer 326 of semiconductor die 320. Another portion of conductive layer 352 is electrically connected to stud bumps 336. Other portions of conductive layer 352 can be electrically common or electrically isolated depending on the design and function of semiconductor die 320.

An insulating or passivation layer 354 is formed over insulating layer 350 and conductive layer 352 using PVD, CVD, printing, spin coating, spray coating, slit coating, rolling coating, lamination, sintering or thermal oxidation. The insulating layer 354 contains one or more layers of SiO2, Si3N4, SiON, Ta2O5, Al2O3, polymer dielectric resist with or without fillers or fibers, or other material having similar structural and insulating properties. A portion of insulating layer 354 is removed by LDA or etching process through a patterned photoresist layer to expose conductive layer 326 and stud bumps 352.

An electrically conductive layer or RDL 356 is formed over insulating layer 354 and conductive layer 352 using a patterning and metal deposition process such as printing, PVD, CVD, sputtering, electrolytic plating and electroless plating. Conductive layer 356 includes one or more layers of Al, Cu, Sn, Ni, Au, Ag, or other suitable electrically conductive material. One portion of conductive layer 356 is electrically connected to conductive layer 352. Other portions of conductive layer 356 can be electrically common or electrically isolated depending on the design and function of semiconductor die 320.

An insulating or passivation layer 358 is formed over insulating layer 354 and conductive layer 356 using PVD, CVD, printing, spin coating, spray coating, slit coating, rolling coating, lamination, sintering or thermal oxidation. The insulating layer 358 contains one or more layers of SiO2, Si3N4, SiON, Ta2O5, Al2O3, polymer dielectric resist with or without fillers or fibers, or other material having similar structural and insulating properties. A portion of insulating layer 358 is removed by LDA or etching process through a patterned photoresist layer to expose conductive layer 356.

An electrically conductive bump material is deposited over conductive layer 356 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 356 using a suitable attachment or bonding process. In one embodiment, the bump material is reflowed by heating the material above its melting point to form balls or bumps 360. In some applications, bumps 360 are reflowed a second time to improve electrical contact to conductive layer 356. In one embodiment, bumps 360 are formed over a UBM having a wetting layer, barrier layer, and adhesive layer. The bumps can also be compression bonded or thermocompression bonded to conductive layer 356. Bumps 360 represent one type of interconnect structure that can be formed over conductive layer 356. The interconnect structure can also use bond wires, conductive paste, stud bump, micro bump, or other electrical interconnect.

The combination of insulating layers 350, 354, and 358 and conductive layers 352 and 356 and bumps 360 constitute a build-up interconnect structure 362. The build-up interconnect structures 362 are inspected and tested to be known good before additional device integration.

Figure 16F:
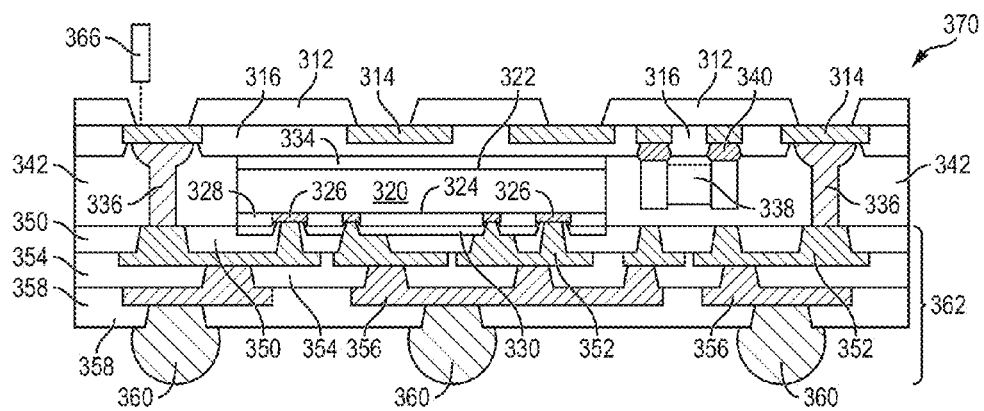

In FIG. 16f, carrier 310 is removed by chemical etching, mechanical peeling, CMP, mechanical grinding, thermal bake, UV light, laser scanning, or wet stripping to expose conductive layer 314 and insulating layer 316. Additional back grinding may be applied to control the warpage. A portion of insulating layer 312 is removed by LDA using laser 366 to expose conductive layer 314. Alternatively, a portion of insulating layer 312 is removed by etching process through a patterned photoresist layer to expose conductive layer 314.

In Fo-WLCSP 370, semiconductor die 320 is electrically connected through build-up interconnect structure 362 and stud bumps 336 to conductive layer 314. Build-up interconnect structure 362 and conductive layer 314 provide vertical and lateral interconnect for semiconductor die 320 on opposite sides (dual sides) of Fo-WLCSP 370. Conductive layer 314 is formed at a different time and separate from build-up interconnect structure 362. The formation and testing of conductive layer 314 prior to die mounting simplifies the manufacturing process and reduces cost. The later formation of build-up interconnect structure 362 with stud bumps 336 providing vertical interconnect between conductive layer 314 and the build-up interconnect structure completes the vertical and lateral interconnect for semiconductor die 320 on opposite sides of Fo-WLCSP 370.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a substrate including a first conductive layer formed over a first surface of the substrate;
forming a plurality of wire studs over the first surface of the substrate;
disposing a semiconductor die over the first surface of the substrate between the wire studs including a first interconnect structure formed on an active surface of the semiconductor die opposite the substrate;
depositing a first encapsulant around the substrate, wire studs, semiconductor die, and first interconnect structure, wherein a portion of the first interconnect structure and first ends of the wire studs are exposed from the encapsulant; and forming a second interconnect structure over a surface of the first encapsulant opposite the substrate and contacting the first interconnect structure and wire studs.

2. The method of claim 1, further including:

forming a second encapsulant around the semiconductor die; and forming the first interconnect structure over the semiconductor die and second encapsulant.

3. The method of claim 1, further including removing a portion of the first encapsulant to expose the first interconnect structure and first ends of the wire studs.

4. The method of claim 1, further including removing a portion of the first encapsulant from over the substrate opposite the semiconductor die.

5. The method of claim 1, further including forming the first encapsulant over a portion of the semiconductor die.

6. The method of claim 1, further including depositing the first encapsulant to cover the first surface of the substrate and a side surface of the substrate approximately perpendicular to the first surface of the substrate.

7. A method of making a semiconductor device, comprising:

providing a substrate;

forming a vertical interconnect structure over a first surface of the substrate;

disposing a semiconductor die over the first surface of the substrate with an active surface of the semiconductor die oriented away from the substrate and including a first conductive layer formed over the active surface prior to disposing the semiconductor die over the first surface of the substrate;

depositing a first encapsulant over the substrate, semiconductor die, and vertical interconnect structure, wherein the vertical interconnect structure and first conductive layer are exposed at a surface of the first encapsulant opposite the substrate; and forming a second interconnect structure over the first encapsulant after depositing the first encapsulant and contacting the first conductive layer and the vertical interconnect structure.

8. The method of claim 7, wherein the substrate includes a second conductive layer with the vertical interconnect structure formed on the second conductive layer.

9. The method of claim 7, further including:

depositing a second encapsulant around the semiconductor die; and forming a build-up interconnect structure over the semiconductor die and second encapsulant, wherein the build-up interconnect structure includes the first conductive layer.

10. The method of claim 7, further including removing a portion of the first encapsulant from over the first conductive layer to expose the first conductive layer from the first encapsulant.

11. The method of claim 7, further including removing the portion of the first encapsulant by planarizing the first encapsulant.

12. The method of claim 7, further including forming the first encapsulant over a portion of the semiconductor die.

13. The method of claim 7, wherein the vertical interconnect structure includes a wire stud.

14. A method of making a semiconductor device, comprising:

forming a first interconnect structure;

providing a semiconductor die;

forming a protection layer over the semiconductor die;

disposing the semiconductor die over a first surface of the first interconnect structure after forming the first interconnect structure;

forming a plurality of stud bumps over the first surface of the first interconnect structure;

depositing an encapsulant over the first interconnect structure, semiconductor die, and stud bumps with the stud bumps exposed from the encapsulant;

removing the protection layer from over the semiconductor die after depositing the encapsulant; and forming a second interconnect structure over the encapsulant, the stud bumps, and the semiconductor die to electrically connect the stud bumps and semiconductor die.

15. The method of claim 14, further including disposing a discrete semiconductor device over the first interconnect structure.

16. The method of claim 14, wherein forming the first interconnect structure includes:

forming a first insulating layer;

forming a conductive layer over the first insulating layer; and forming a second insulating layer over the first insulating layer and conductive layer.

17. The method of claim 16, further including removing a portion of the second insulating layer by laser direct ablation.

18. The method of claim 16, further including forming a third insulating layer over the second insulating layer and conductive layer.

19. The method of claim 14, wherein forming the second interconnect structure includes:

forming a first insulating layer over the encapsulant and semiconductor die;

forming a first conductive layer over the first insulating layer;

forming a second insulating layer over the first insulating layer and first conductive layer;

forming a second conductive layer over the second insulating layer and first conductive layer; and forming a third insulating layer over the second insulating layer and second conductive layer.

20. A method of making a semiconductor device, comprising:

providing a substrate;

forming a wire stud on a first surface of the substrate;

disposing a semiconductor die on the first surface of the substrate;

depositing an encapsulant over the semiconductor die, wire stud, and substrate;

removing a portion of the encapsulant from over the semiconductor die and wire stud;

forming a first interconnect structure over the encapsulant with the first interconnect structure physically contacting the wire stud and electrically connected to the semiconductor die;

forming a protection layer over the semiconductor die prior to depositing the encapsulant;

removing the protection layer after depositing the encapsulant; and forming the first interconnection structure after removing the protection layer.

21. The method of claim 20, wherein the substrate further includes a second interconnect structure.

22. The method of claim 20, further including removing a second portion of the encapsulant from over the substrate opposite the semiconductor die.

23. The method of claim 20, further including:
- singulating the substrate;
- disposing the substrate over a carrier with the semiconductor die oriented toward the carrier after singulating the substrate;
- depositing the encapsulant over the substrate and carrier; and
- removing the carrier after depositing the encapsulant.

24. The method of claim 23, further including depositing the encapsulant to completely cover the substrate and carrier.

* * * * *